(12) United States Patent
Yamazaki et al.

(10) Patent No.: US 12,014,175 B2
(45) Date of Patent: Jun. 18, 2024

(54) DATA PROCESSING SYSTEM AND OPERATION METHOD OF DATA PROCESSING SYSTEM

(71) Applicant: Semiconductor Energy Laboratory Co., Ltd., Atsugi (JP)

(72) Inventors: Shunpei Yamazaki, Setagaya (JP); Hajime Kimura, Atsugi (JP); Tatsuya Onuki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/844,213

(22) Filed: Jun. 20, 2022

(65) Prior Publication Data
US 2022/0318011 A1 Oct. 6, 2022

Related U.S. Application Data

(63) Continuation of application No. 17/074,872, filed on Oct. 20, 2020, now Pat. No. 11,379,231.

(30) Foreign Application Priority Data

Oct. 25, 2019 (JP) .................................. 2019-194589

(51) Int. Cl.
*G06F 9/30* (2018.01)
*G11C 11/402* (2006.01)
(Continued)

(52) U.S. Cl.
CPC .......... *G06F 9/3001* (2013.01); *G06F 9/3004* (2013.01); *G11C 11/4023* (2013.01);
(Continued)

(58) Field of Classification Search
CPC . G06F 9/3001; G06F 9/3004; G11C 11/4023; G11C 11/4085; G11C 11/4093;
(Continued)

(56) References Cited

U.S. PATENT DOCUMENTS 5,570,315 A 10/1996 Tanaka et al.
7,952,392 B2 5/2011 Koyama et al.
(Continued)

FOREIGN PATENT DOCUMENTS

JP 07-093979 A 4/1995
JP 2001-006374 A 1/2001
(Continued)

OTHER PUBLICATIONS

JP-2015015065-A, Jan. 2015, JP, Arisaka K, "Recording Device" (Year: 2015).*
(Continued)

*Primary Examiner* — Farley Abad
(74) *Attorney, Agent, or Firm* — Eric J. Robinson; Robinson Intellectual Property Law Office, P.C.

(57) ABSTRACT

To provide a data processing system that includes a nonvolatile memory device capable of storing multilevel data and enables increasing storage capacity of a main memory device when the data processing system is activated. The data processing system includes an arithmetic processing device, a main memory device, and a nonvolatile memory device. The main memory device includes a volatile memory device, and the nonvolatile memory device is configured to store multilevel data in one memory cell. When the data processing system is deactivated, the nonvolatile memory device stores binary data, whereby the stored data can be held for a long time. Upon activation, the nonvolatile memory device stores multilevel data, whereby increasing storage capacity. When the storage capacity is increased, a free space is generated in the nonvolatile memory device, which can be used as a part of the main memory device of the data processing system.

3 Claims, 24 Drawing Sheets

(51) Int. Cl.
  *G11C 11/408* (2006.01)
  *G11C 11/4093* (2006.01)
  *G11C 11/4094* (2006.01)

(52) U.S. Cl.
  CPC ...... *G11C 11/4085* (2013.01); *G11C 11/4093* (2013.01); *G11C 11/4094* (2013.01)

(58) Field of Classification Search
  CPC .............. G11C 11/4094; G11C 11/565; G11C 2211/5641; G11C 11/405
  See application file for complete search history.

(56) References Cited

U.S. PATENT DOCUMENTS

| | | | |
|---|---|---|---|
| 8,021,916 B2 | 9/2011 | Akimoto et al. | |
| 8,021,917 B2 | 9/2011 | Akimoto et al. | |
| 8,115,883 B2 | 2/2012 | Yamazaki et al. | |
| 8,218,099 B2 | 7/2012 | Yamazaki et al. | |
| 8,236,627 B2 | 8/2012 | Tsubuku et al. | |
| 8,242,837 B2 | 8/2012 | Yamazaki et al. | |
| 8,268,642 B2 | 9/2012 | Yoshitomi et al. | |
| 8,319,216 B2 | 11/2012 | Akimoto et al. | |
| 8,378,344 B2 | 2/2013 | Sakakura et al. | |
| 8,383,470 B2 | 2/2013 | Akimoto et al. | |
| 8,389,989 B2 | 3/2013 | Yamazaki et al. | |
| 8,400,187 B2 | 3/2013 | Yamazaki et al. | |
| 8,421,067 B2 | 4/2013 | Yamazaki et al. | |
| 8,421,068 B2 | 4/2013 | Yamazaki et al. | |
| 8,421,069 B2 | 4/2013 | Yamazaki et al. | |
| 8,421,083 B2 | 4/2013 | Yamazaki et al. | |
| 8,481,377 B2 | 7/2013 | Akimoto et al. | |
| 8,492,764 B2 | 7/2013 | Yamazaki et al. | |
| 8,597,992 B2 | 12/2013 | Sasagawa et al. | |
| 8,625,085 B2 | 1/2014 | Watanabe et al. | |
| 8,637,354 B2 | 1/2014 | Sasagawa et al. | |
| 8,654,272 B2 | 2/2014 | Yamazaki et al. | |
| 8,669,556 B2 | 3/2014 | Yamazaki et al. | |
| 8,698,214 B2 | 4/2014 | Honda et al. | |
| 8,729,613 B2 | 5/2014 | Honda et al. | |
| 8,742,422 B2 | 6/2014 | Sakakura et al. | |
| 8,766,608 B2 | 7/2014 | Yamazaki et al. | |
| 8,785,241 B2 | 7/2014 | Sasagawa et al. | |
| 8,803,142 B2 | 8/2014 | Yamazaki et al. | |
| 8,841,661 B2 | 9/2014 | Akimoto et al. | |
| 8,854,286 B2 | 10/2014 | Yamazaki et al. | |
| 8,860,023 B2 | 10/2014 | Tsubuku et al. | |
| 8,871,565 B2 | 10/2014 | Yamazaki et al. | |
| 8,872,179 B2 | 10/2014 | Tsubuku | |
| 8,890,159 B2 | 11/2014 | Yamazaki et al. | |
| 8,890,166 B2 | 11/2014 | Sakakura et al. | |
| 8,895,976 B2 | 11/2014 | Tsubuku et al. | |
| 8,901,552 B2 | 12/2014 | Yamazaki et al. | |
| 8,952,380 B2 | 2/2015 | Honda et al. | |
| 8,952,726 B2 | 2/2015 | Yamazaki et al. | |
| 8,963,517 B2 | 2/2015 | Yamazaki et al. | |
| 9,029,852 B2 | 5/2015 | Honda et al. | |
| 9,035,301 B2 | 5/2015 | Takahashi et al. | |
| 9,064,966 B2 | 6/2015 | Yamazaki et al. | |
| 9,082,858 B2 | 7/2015 | Tsubuku et al. | |
| 9,087,744 B2 | 7/2015 | Tsubuku et al. | |
| 9,218,966 B2 | 12/2015 | Honda et al. | |
| 9,219,160 B2 | 12/2015 | Honda et al. | |
| 2003/0007384 A1* | 1/2003 | Shimizu | G11C 11/56 365/185.03 |
| 2006/0171210 A1 | 8/2006 | Nagashima et al. | |
| 2011/0057918 A1 | 3/2011 | Kimura et al. | |
| 2011/0062435 A1 | 3/2011 | Yamazaki et al. | |
| 2011/0090204 A1 | 4/2011 | Yamazaki et al. | |
| 2011/0227082 A1 | 9/2011 | Inoue et al. | |
| 2012/0051119 A1 | 3/2012 | Yamazaki et al. | |
| 2012/0086000 A1 | 4/2012 | Mizoguchi et al. | |
| 2012/0193620 A1 | 8/2012 | Godo et al. | |
| 2014/0003142 A1* | 1/2014 | Lee | G11C 16/10 365/185.03 |
| 2014/0077205 A1 | 3/2014 | Yamazaki et al. | |
| 2014/0113405 A1 | 4/2014 | Tsubuku et al. | |
| 2014/0124776 A1 | 5/2014 | Takahashi et al. | |
| 2014/0177345 A1* | 6/2014 | Yamazaki | G11C 11/4076 365/189.03 |
| 2014/0241978 A1 | 8/2014 | Yamazaki et al. | |
| 2014/0252345 A1 | 9/2014 | Tsubuku et al. | |
| 2015/0034947 A1 | 2/2015 | Yamazaki et al. | |
| 2015/0041801 A1 | 2/2015 | Yamazaki et al. | |
| 2015/0084043 A1 | 3/2015 | Ishihara et al. | |
| 2015/0179810 A1 | 6/2015 | Yamazaki et al. | |
| 2015/0241510 A1 | 8/2015 | Tsubuku et al. | |
| 2015/0263007 A1 | 9/2015 | Yamazaki et al. | |
| 2015/0364610 A1 | 12/2015 | Tsubuku et al. | |
| 2017/0068488 A1 | 3/2017 | Shibatani et al. | |
| 2020/0117599 A1 | 4/2020 | Golov | |

FOREIGN PATENT DOCUMENTS

| | | |
|---|---|---|
| JP | 2007-257109 A | 10/2007 |
| JP | 2014-142986 A | 8/2014 |
| JP | 2015-228197 A | 12/2015 |

OTHER PUBLICATIONS

Yamazaki.S et al., "Properties of crystalline In—Ga—Zn—oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Yamazaki.S et al., "Research, Development, and Application of Crystalline Oxide Semiconductor", SID Digest '12: SID International Symposium Digest of Technical Papers, Jun. 5, 2012, vol. 43, No. 1, pp. 183-186.

* cited by examiner

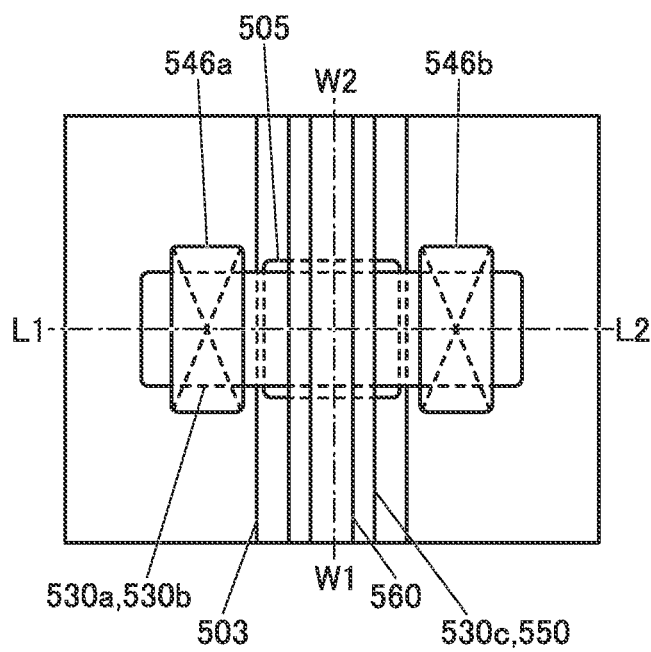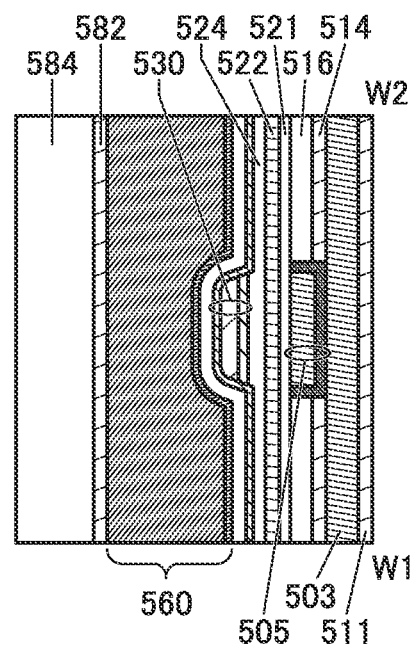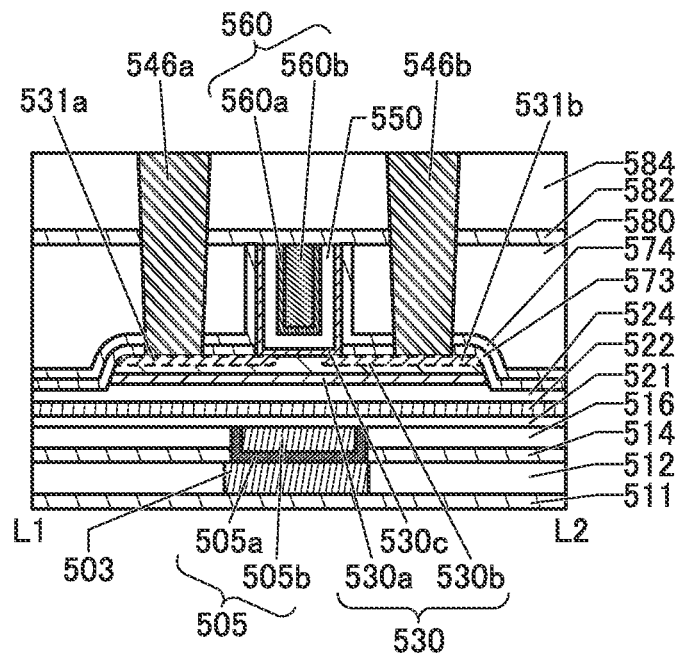

FIG. 23A
Intermediate state
New crystalline phase
| Amorphous | Crystalline | Crystal |
|---|---|---|
| •completely amorphous | •CAAC<br>•nc<br>•CAC | •single crystal<br>•poly crystal |
FIG. 23B
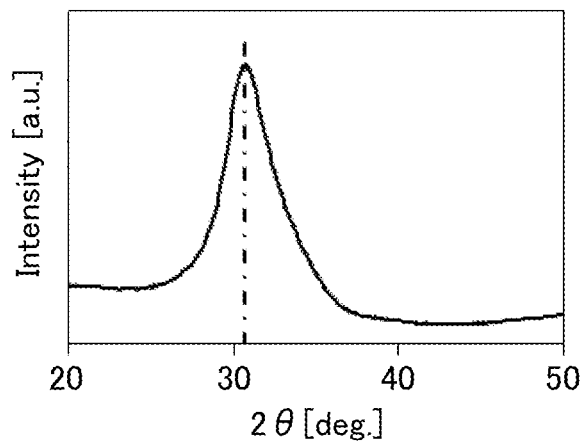
FIG. 23C
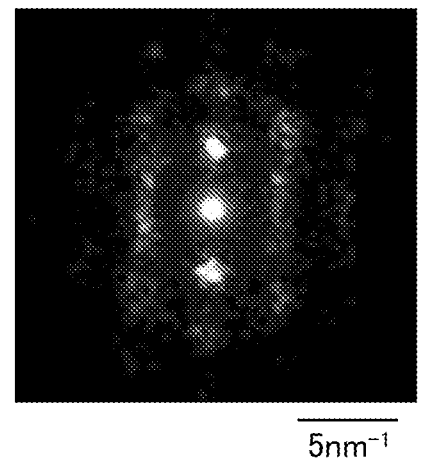

5500

5400

5200

DATA PROCESSING SYSTEM AND OPERATION METHOD OF DATA PROCESSING SYSTEM

BACKGROUND OF THE INVENTION

1. Field of the Invention

The present invention relates to a data processing system. In particular, the present invention relates to a data processing system including a memory device (also referred to as a semiconductor memory device or memory) utilizing semiconductor characteristics.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

2. Description of the Related Art

The data processing systems such as personal computers and portable information terminals such as smartphones, which have been used widely in recent years, for example, include arithmetic processing devices such as central processing units (CPUs) and graphics processing units (GPUs), volatile memory devices such as dynamic random access memory (DRAM) and static RAM (SRAM), which are used when the arithmetic processing device performs arithmetic processing, and nonvolatile memory devices which can hold stored data even after the power is not supplied. The memory device used when the arithmetic processing device performs arithmetic processing is called main memory device (also referred to as main memory).

As nonvolatile memory devices, a hard disc drive (HDD) has been mainly used for a long time, but the memory device that has become popular in recent years is a solid state drive (SSD) using flash memory, which is a lightweight device, has no physical operation portion, and reads data at high speed. In this specification and the like, a memory device utilizing semiconductor characteristics, e.g., DRAM, SRAM, flash memory, or the like, is referred to as a semiconductor memory device (also referred to as memory).

One of known transistors is a transistor using an oxide semiconductor or a metal oxide in a channel formation region (also referred to as an oxide semiconductor (OS) transistor). A feature of the OS transistor is an extremely low drain current in an off-state (the current is also referred to as off-state current) (for example, see Non-Patent Documents 1 and 2), which has been increasing an interest in the OS transistor. DRAM is a memory device that includes memory cells each being composed of one transistor and one capacitor and stores data by accumulating electric charge in the capacitor. Therefore, when the OS transistor is used in the memory cell of DRAM, stored data can be held for a long time.

A memory cell of DRAM may be composed of two transistors and one capacitor. The memory cell has such characteristics that electric charge accumulated in the capacitor is amplified by a neighboring transistor, whereby data can be stored even with small capacitance of the capacitor and non-destructive data reading can be performed, for example (hereinafter, such a memory cell is referred to as a gain-cell memory cell). In this specification and the like, a memory device including a gain-cell memory cell using an OS transistor is referred to as a nonvolatile oxide semiconductor random access memory (registered trademark, NOSRAM).

For oxide semiconductors, a c-axis-aligned crystalline (CAAC) structure and a nanocrystalline (nc) structure, which are neither a single crystal structure nor an amorphous structure, have been discovered (see Non-Patent Documents 1 and 3). Non-Patent Documents 1 and 3 each disclose a technique for forming a transistor with use of an oxide semiconductor having the CAAC structure.

REFERENCE

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Yamazaki et al., SID Symposium Digest of Technical Papers, 2012, Volume 43, Issue 1, pp. 183-186.

SUMMARY OF THE INVENTION

Requirements for the above data processing system are high-speed processing of a large amount of data as well as reductions in size, power consumption, and cost of the data processing system, and the like. In other words, a high-speed operation and large capacitance are respectively required for an arithmetic processing device and a memory device in the data processing system; meanwhile reductions in size, power consumption, and cost, and the like are required for the data processing system. In this specification and the like, one of objects is to provide a data processing system including a main memory device with small storage capacity which can be increased when the data processing system is activated.

One of objects of one embodiment of the present invention is to provide a data processing system including a main memory device with small storage capacity. Another object of one embodiment of the present invention is to provide a data processing system that enables storage capacity of a main memory device to be increased when the data processing system is activated.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

One embodiment of the present invention is a data processing system including an arithmetic processing device and a nonvolatile memory device. The nonvolatile memory device includes a plurality of memory cells, has a function of storing s-bit (s is an integer greater than or equal to 1) data in each of the memory cells when the data processing system is not activated, and has a function of storing t-bit (t is an integer greater than or equal to 2) data in each of the memory cells when the data processing system is activated. An integer value of s is smaller than an integer value of t. The arithmetic processing device has a function of performing arithmetic processing using the nonvolatile memory device when the data processing system is activated.

Another embodiment of the present invention is a data processing system including an arithmetic processing device, a first memory device, and a second memory device. The second memory device is a nonvolatile device and includes a plurality of memory cells. The second memory device has a function of storing s-bit (s is an integer greater than or equal to 1) data in each of the memory cells when the data processing system is not activated, and a function of storing t-bit (t is an integer greater than or equal to 2) data in each of the memory cells when the data processing system is activated. An integer value of s is smaller than an integer value of t. The arithmetic processing device has a function of performing arithmetic processing using the first memory device and the second memory device when the data processing system is activated.

In the above mode, s is 1.

In the above mode, the memory cell includes a transistor, and the transistor includes a metal oxide in a channel formation region.

Another embodiment of the present invention is an operation method of a data processing system including an arithmetic processing device and a nonvolatile memory device. The nonvolatile memory device includes a plurality of memory cells, stores s-bit (s is an integer greater than or equal to 1) data in the memory cells when the data processing system is not activated, and stores t-bit (t is an integer greater than or equal to 2) data in the memory cells when the data processing system is activated. An integer value of s is smaller than an integer value of t. The arithmetic processing device performs arithmetic processing using the nonvolatile memory device when the data processing system is activated.

Another embodiment of the present invention is an operation method of a data processing system including an arithmetic processing device, a first memory device, and a second memory device. The second memory device is nonvolatile and includes a plurality of memory cells. The second memory device stores s-bit (s is an integer greater than or equal to 1) data in the memory cells when the data processing system is not activated, and stores t-bit (t is an integer greater than or equal to 2) data in the memory cells when the data processing system is activated. An integer value of s is smaller than an integer value of t. The arithmetic processing device performs arithmetic processing using the first memory device and the second memory device when the data processing system is activated.

In the above mode, s is 1.

In the above mode, the memory cell includes a transistor, and the transistor includes a metal oxide in a channel formation region.

According to one embodiment of the present invention, a data processing system including a main memory device with small storage capacity can be provided. Alternatively, according to one embodiment of the present invention, a data processing system that enables storage capacity of a main memory device to be increased when the data processing system is activated can be provided.

Note that the description of these effects does not preclude the existence of other effects. One embodiment of the present invention does not necessarily obtain all the effects. Other effects will be apparent from and can be derived from the description of the specification, the claims, the drawings, and the like.

BRIEF DESCRIPTION OF THE DRAWINGS

FIG. 18A is a top view illustrating a structure example of a transistor, and FIGS. 18B and 18C are cross-sectional views illustrating a structure example of the transistor.

FIG. 23A shows classification of an IGZO crystal structure, FIG. 23B shows an XRD spectrum of a CAAC-GIZO film, and FIG. 23C shows a nanobeam electron diffraction pattern of the CAAC-IGZO film.

DETAILED DESCRIPTION OF THE INVENTION

Figure 1A:
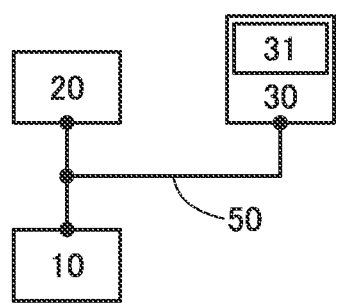
FIGS. 1A to 1E are each a block diagram illustrating a structure example of a data processing system.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Any of the embodiments described below can be combined as appropriate. In the case where a plurality of structure examples are described in one embodiment, some of the structure examples can be combined as appropriate.

Note that in diagrams attached to this specification, components are classified according to their functions and shown as independent blocks; however, it is practically difficult to completely separate the components according to their functions, and one component may have a plurality of functions.

In the drawings, the size, the layer thickness, the region, or the like is sometimes exaggerated for clarity, and thus is not limited to the illustrated scale. Therefore, the size, the layer thickness, or the region is not limited to the illustrated scale. The drawings are schematic views showing ideal examples, and embodiments of the present invention are not limited to shapes or values shown in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged with each other. For example, the term "conductive layer" can be changed to the term "conductive film" in some cases. Also, for example, the term "insulating film" can be changed to the term "insulating layer" in some cases.

In this specification and the like, the terms for describing arrangement such as "over" and "below" do not necessarily mean directly over and directly below, respectively, in the description of a physical relationship between components. For example, the expression "a gate electrode over a gate insulating layer" can mean the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components denoted by the same reference numerals need to be distinguished from each other, "_1", "_2", "[n]", "[m, n]", and the like are sometimes added to the reference numerals. For example, the second wiring GL is referred to as a wiring GL[2].

In this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring. Even when the expression "being electrically connected" is used, there is a case in which no physical connection is made and a wiring is just extended in an actual circuit.

In addition, in this specification and the like, the term such as "electrode" or "wiring" does not limit the function of the component itself. For example, an "electrode" is used as part of a "wiring" in some cases, and vice versa.

In this specification and the like, a "terminal" in an electric circuit refers to a portion that inputs or outputs current or potential or receives or transmits a signal. Accordingly, part of a wiring or an electrode functions as a terminal in some cases.

In general, a "capacitor" has a structure in which two electrodes face each other with an insulator (dielectric) provided therebetween. In this specification and the like, the "capacitor" includes one having a structure in which two wirings face each other with an insulator provided therebetween or one in which two wirings are positioned with an insulator provided therebetween, in addition to the one having a structure in which two electrodes face each other with an insulator provided therebetween.

In this specification and the like, the term "voltage" often refers to a difference between a given potential and a reference potential (e.g., a ground potential). Therefore, the terms "voltage" and "potential difference" can be replaced with each other.

In this specification and the like, a transistor is an element having at least three terminals: a gate, a drain, and a source. Further, a channel formation region is provided between a source (a source terminal, a source region, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or when a direction of current flow is changed in circuit operation, for example. Therefore, the terms "source" and "drain" can be used interchangeably in this specification and the like.

Unless otherwise specified, off-state current in this specification and the like refers to drain current of a transistor in an off state (also referred to as non-conducting state or cutoff state). Unless otherwise specified, the off state of an n-channel transistor means that a gate voltage with respect to a source voltage ($V_{gs}$) is lower than the threshold voltage ($V_{th}$), and the off state of a p-channel transistor means that $V_{gs}$ is higher than $V_{th}$. That is, the off-state current of an n-channel transistor sometimes refers to a drain current that flows when the gate voltage with respect to the source voltage $V_{gs}$ is lower than the threshold voltage $V_{th}$.

In the above description of off-state current, a drain may be replaced with a source. That is, the off-state current sometimes refers to a source current when the transistor is in an off state. In addition, the term "leakage current" sometimes expresses the same meaning as off-state current. In this specification and the like, the off-state current sometimes refers to a current that flows between a source and a drain when a transistor is in the off state.

In this specification and the like, the on-state current sometimes refers to a current that flows between a source and a drain when a transistor is in the on state (also referred to as conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, a metal oxide used in a channel formation region of a transistor is called an oxide semiconductor in some cases. That is, in the case where a metal oxide has at least one of amplifying, rectifying, and switching effects, the metal oxide can be referred to as a metal oxide semiconductor. Thus, a transistor including a metal oxide in a channel formation region can be referred to as an "oxide semiconductor transistor" or an "OS transistor". Similarly, the "transistor using an oxide semiconductor" described above is also a transistor containing a metal oxide in a channel formation region.

In this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, a structure example and an operation example of data processing system which is one embodiment of the present invention will be described.

<Structure Example of Data Processing System>

FIG. 1A is a block diagram illustrating a structure example of a data processing system 70 of one embodiment of the present invention. The data processing system 70 includes an arithmetic processing device 10, a memory device 20, and a memory device 30.

Figure 1B:
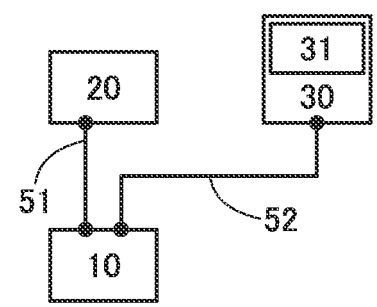

The arithmetic processing device 10, the memory device 20, and the memory device 30 are connected with a bus 50, and data can be transmitted therebetween. The memory device 20 and the memory device 30 may be connected to each other via the arithmetic processing device 10. Specifically, in the data processing system 70 as illustrated in FIG. 1B, the arithmetic processing device 10 and the memory device 20 may be connected with a bus 51, and the arithmetic processing device 10 and the memory device 30 may be connected with a bus 52. Note that in the drawings described in this specification and the like, the flow of main signals is indicated by an arrow or a line, and a power supply line and the like are omitted in some cases.

A CPU, a GPU, or the like can be used for the arithmetic processing device 10 that has a function of performing arithmetic processing in accordance with a program. A volatile memory device such as a DRAM or an SRAM can be used for the memory device 20 that functions as a main memory device used when the arithmetic processing device 10 performs arithmetic processing. The memory device 30 is a nonvolatile memory device that can hold data stored for a predetermined time even after power is not supplied. The memory device 30 has a function of storing multilevel data greater than or equal to 2-bit (4-level) data in one memory cell (also referred to a multilevel cell (MLC)). Note that the memory device 30 includes a memory region 31 for description.

Figure 1C:
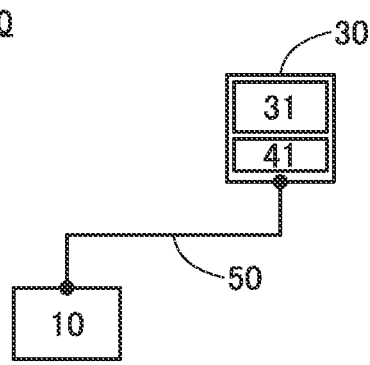

The data processing system 70 may include a temporary storage region in the memory device 30 so as to omit the memory device 20. FIG. 1C is a block diagram illustrating a structure example of the data processing system 70 without the memory device 20. In FIG. 1C, the memory device 30 includes a temporary storage region 41.

<Operation Example of Data Processing System>

Figure 2:
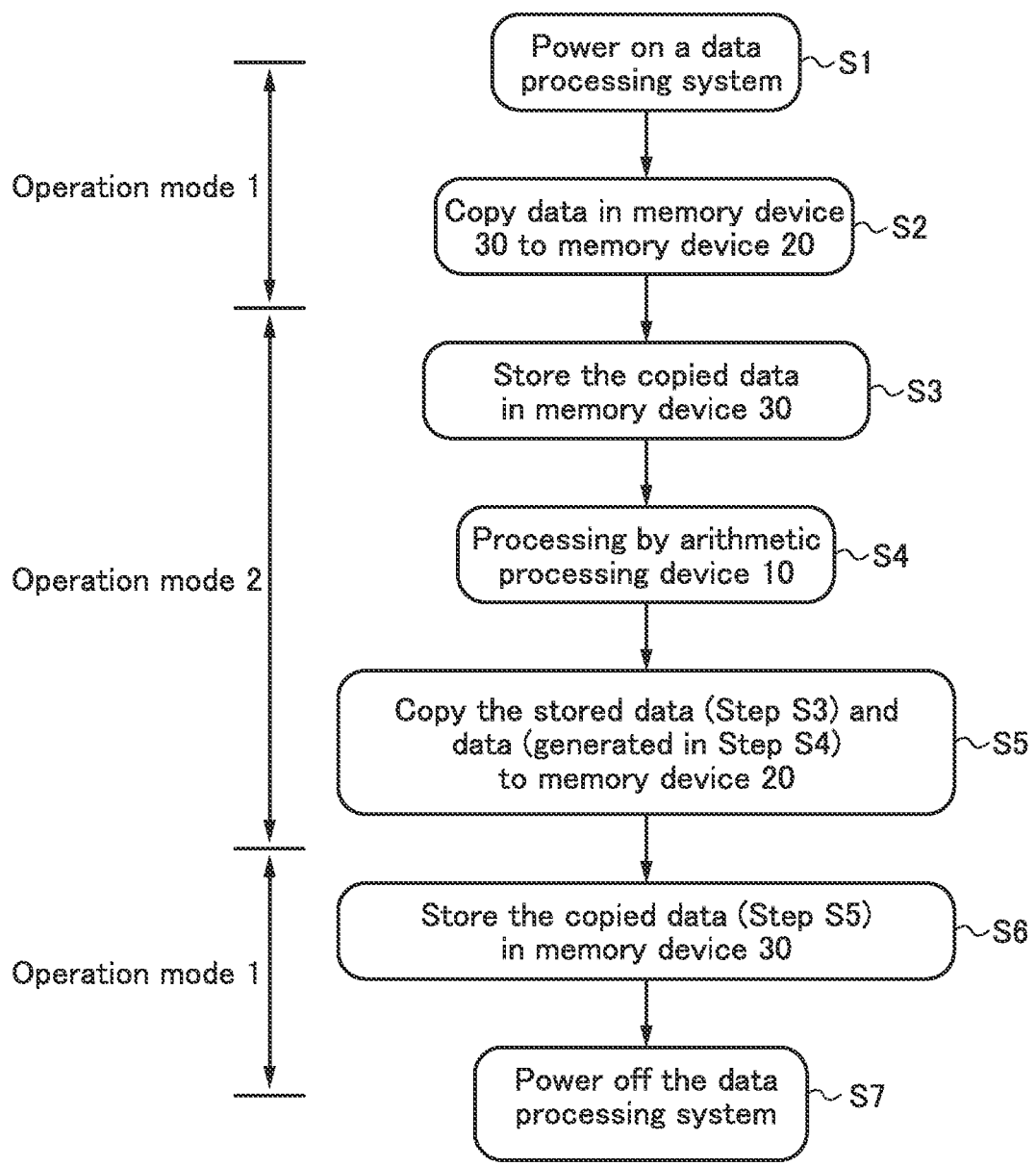
FIG. 2 is a flow chart showing an operation example of a data processing system.

FIG. 2 is a flow chart showing an operation example of the data processing system 70. Operation modes of the memory device 30 are shown on the left side of the flow chart in FIG. 2.

In Step S1, power is supplied to the data processing system 70. At this time, binary data is stored in the memory device 30, and this state is referred to as an operation mode 1. Here, binary data is 1-bit data which is represented by two states called high-level and low level (also referred to as High and Low, H and L, 1 and 0, or the like) for example.

In Step S2, the data processing system 70 reads out data stored in the memory device 30 and copies the data to the memory device 20. The memory device 30 shifts its operation mode to an operation mode 2 where multilevel data is stored.

Figure 1D:
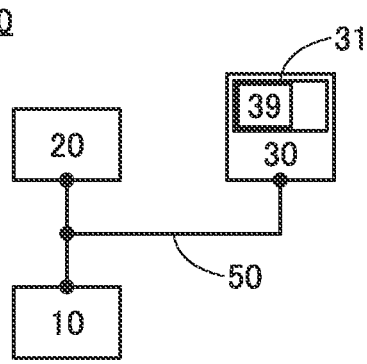

In Step S3, the data processing system 70 stores the data copied to the memory device 20 in the memory device 30. At this time, multilevel data is stored in the memory device 30. Since the binary data stored in the memory device 30 is stored in the memory device 30 as multilevel data, storage capacity of the memory device 30 is increased, and a free space 39 is generated in the memory region 31 (see FIG. 1D).

In this state, the arithmetic processing device 10 performs arithmetic processing using the memory device 20 and the free space 39 (Step S4). The arithmetic processing device 10 can use the memory device 20 and the free space 39 as a main memory device; accordingly, storage capacity of the main memory device can be increased compared to the case where only the memory device 20 is used as the main memory device. Thus, the data processing system 70 may allow the memory device 20 to have small storage capacity.

After the arithmetic processing of the arithmetic processing device 10 is finished, the data processing system 70 reads out the multilevel data which is stored in the memory device 30 in Step S3 and data which is newly generated in Step S4, and copies the read-out data to the memory device 20 (Step S5). The memory device 30 shifts its operation mode to the operation mode 1 where binary data is stored.

In Step S6, the data which is copied to the memory device 20 in Step S5 is stored in the memory device 30. At this time, the memory device 30 stores binary data.

In Step S7, power supply to the data processing system 70 is stopped. The memory device 30 in the operation mode 1 where binary data is stored enables data stored without power supply to be held for a longer time than that in the operation mode 2 where multilevel data is stored.

Note that the data stored in the operation mode 1 is not limited to binary data. For example, in the operation mode 1, s-bit (s is an integer greater than or equal to 1) data is stored in one memory cell, and in the operation mode 2, t-bit (t is an integer greater than or equal to 2) data is stored in one memory cell. In the case where an integer value of s is smaller than that of t, the data which is stored without power supply can be held for a longer time in the operation mode 1 than in the operation mode 2.

<Storage Capacity>

For example, the memory device 30 includes B (B is an integer greater than or equal to 4) memory cells, and the multilevel data of M-bit (M is an integer greater than or equal to 2) can be stored in each memory cell. In other words, the storage capacity of the memory device 30 is B bits in the operation mode 1, and that is B×M bits in the operation mode 2.

In the case where B-bit data is stored in the memory device 30 in Step S1 and Step S2, the memory device 30 and the free space 39 store B-bit data and B×(M−1)-bit data, respectively, in Step S3. The arithmetic processing device 10 enables arithmetic processing using B×(M−1) bits in addition to the storage capacity of the memory device 20.

Figure 1E:
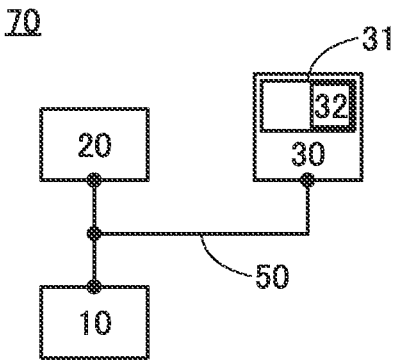

Furthermore, in Step S2, part of data stored in the memory device 30 may be copied to the memory device 20. In other words, the memory device 30 may include a binary data region 32 storing binary data in the operation mode 2 as a part of the memory region 31 (see FIG. 1E). The binary data region 32 can hold the stored data for a long time, and thus can store an important program accessed by the arithmetic processing device 10 frequently, for example.

The storage capacity of the memory device 20 is preferably greater than or equal to B bits because the data stored in the memory device 30 in Steps S2 and S5 or data that is to be held in the memory device 30 in the following step can be copied to the memory device 20 at once. However, the storage capacity is not limited thereto.

Although the details of the memory device 30 are described later, the storage capacity of the memory device 20 may be greater than or equal to n×M bits (n is an integer greater than or equal to 2) in the case where n memory cells are electrically connected to one word line in the memory device 30. With such storage capacity, the following operations are allowed: data is held by each row in the memory device 30 in Step S3; and the data, which is supplied from each word line and held in the memory device 30 in Step S3, is copied to the memory device 20 in Step S5. For example, the above condition is preferable for a case where the data processing system 70 has such a structure that the memory device 20 is not provided and the size of the temporary storage region 41 in the memory device 30 is reduced.

This embodiment can be implemented in combination with any of the other embodiments described in this specification as appropriate.

Embodiment 2

In Embodiment 2 and Embodiment 3, a structure example and an operation example of a memory device 270 according to one embodiment of the present invention will be described. The memory device 270 is an example of a memory device that can be used for the above-described memory device 30 and includes a gain-cell memory cell using an OS transistor. In other words, the memory device 270 is an NOSRAM as described above.

Note that a memory device that can be used for the memory device 30 is not limited to the memory device 270. For example, a memory device including a memory cell composed of one OS transistor and one capacitor or a memory device such as a NAND flash memory, a NOR flash memory, a magnetoresistive RAM (MRAM), a phase change RAM (PRAM), a resistive RAM (ReRAM), or a ferroelectric RAM (FeRAM) may be used. Alternatively, a combination of any of the memory devices may be used.

In Embodiment 2, examples of circuit structures and operations of a memory cell included in the memory device 270 will be described. In Embodiment 3, examples of structures and operations of the memory device 270 will be described. Note that the memory device 270 may include a driver circuit, a power supply circuit, or the like provided over another substrate, as well as the memory cell.

<Memory Cell Structure Example>

Figure 3A:
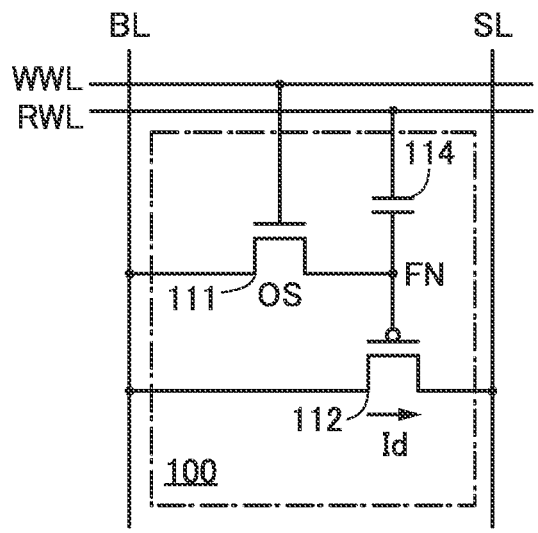
FIG. 3A is a circuit diagram illustrating a structure example of a memory cell.

FIG. 3A is a circuit diagram illustrating a structure example of a memory cell 100.

The memory cell 100 shown in FIG. 3A includes a transistor 111, a transistor 112, and a capacitor 114. Note that in the actual case, a plurality of memory cells 100 are arranged in a matrix, though not illustrated in FIG. 3A.

A gate of the transistor 111 is connected to a write word line WWL. One of a source and a drain of the transistor 111 is connected to a bit line BL. The other of the source and the drain of the transistor 111 is connected to a floating node FN.

A gate of the transistor 112 is connected to the floating node FN. One of a source and a drain of the transistor 112 is connected to the bit line BL. The other of the source and the drain of the transistor 112 is connected to a power supply line SL.

One electrode of the capacitor 114 is connected to the floating node FN. The other electrode of the capacitor 114 is connected to a read word line RWL.

A word signal is supplied to the write word line WWL.

The word signal is a signal which turns on the transistor 111 so that the potential of the bit line BL is supplied to the floating node FN.

Note that in this specification and the like, "writing of data to the memory cell" means that a word signal supplied to the write word line WWL is controlled so that the potential of the floating node FN reaches a potential corresponding to the potential of the bit line BL. Furthermore, "reading of data from the memory cell" means that a read signal supplied to the read word line RWL is controlled so that the potential of the bit line BL reaches a potential corresponding to the potential of the floating node FN.

Multilevel data is supplied to the bit line BL. Furthermore, a precharge potential $V_{precharge}$ for reading data and an initialization potential $V_{initial}$ are supplied to the bit line BL.

Multilevel data is k-bit data (k is a natural number of 2 or more). Specifically, 2-bit data is 4-level data, namely, a signal having any one of the four levels of potential.

The precharge potential $V_{precharge}$ is a potential which is supplied to the bit line BL to perform reading of data. After the precharge potential $V_{precharge}$ is supplied, the bit line BL is brought into an electrically floating state.

Note that in this specification and the like, an "electrically floating state" refers to a state where an element is electrically isolated (also referred to as floating).

The initialization potential $V_{initial}$ is a potential which is supplied to initialize the potential of the bit line BL.

A read signal is supplied to the read word line RWL.

The read signal is a signal which is supplied to the other electrode of the capacitor 114 to perform reading of data from the memory cell 100 in a selective manner.

The floating node FN corresponds to any node on a wiring which connects one electrode of the capacitor 114, the other of the source and the drain of the transistor 111, and the gate of the transistor 112.

Note that in this specification and the like, a "node" refers to any point on a wiring provided to connect elements electrically.

Note that the potential of the floating node FN is based on the multilevel data supplied to the bit line BL. The floating node FN is in an electrically floating state when the transistor 111 is turned off. Thus, in the case where the potential of the read signal supplied to the read word line RWL is changed, the potential of the floating node FN reaches a potential which is the sum of the previous potential and the amount of change in the potential of the read signal. The change in the potential is due to capacitive coupling of the capacitor 114 which is caused by the change of the read signal supplied to the read word line RWL.

The power supply line SL is supplied with a discharge potential $V_{discharge}$ which is lower than the precharge potential $V_{precharge}$ supplied to the bit line BL.

The discharge potential $V_{discharge}$ is supplied to the power supply line SL to change the precharge potential $V_{precharge}$ supplied to the bit line BL by discharging via the transistor 112.

The transistor 111 has a function of a switch for controlling writing of data by being switched between a conducting state and a non-conducting state. While being kept in an off state, the transistor 111 also has a function of holding a potential based on written data. Note that the transistor 111 is also referred to as a first transistor. Furthermore, the transistor 111 is an n-channel transistor in the description.

As the transistor 111, it is preferable to use a transistor having a low current (low off-state current) that flows between a source and a drain in a non-conducting state. Thus, an OS transistor can be used as the transistor 111 (in FIG. 3A and the like, "OS" is written beside the transistor 111). The oxide semiconductor has a bandgap that is higher than or equal to 2.5 eV, preferably higher than or equal to 3.0 eV; thus, an OS transistor has low leakage current due to thermal excitation and extremely low off-state current.

A metal oxide contained in a channel formation region of the OS transistor is preferably an oxide semiconductor containing at least one of indium (In) and zinc (Zn). A typical example of such an oxide semiconductor is an In-M-Zn oxide (the element M is one or more elements selected from Al, Ga, Y, and Sn, for example). By reducing impurities serving as electron donors, such as moisture or hydrogen, and also reducing oxygen vacancies, an i-type (intrinsic) or substantially i-type oxide semiconductor can be obtained. Such an oxide semiconductor can be referred to as a highly purified oxide semiconductor. The details of the OS transistor will be described in Embodiment 4 or Embodiment 5.

In an OS transistor, a normalized off-state current per micrometer of channel width at a source-drain voltage of 10 V at a room temperature can be less than or equal to $10 \times 10^{-21}$ A (10 zA (zeptoampere)), for example. The use of an OS transistor as the transistor 111 enables the transistor 111 to hold a potential based on data for a long time.

In the configuration of the memory cell 100 illustrated in FIG. 3A, a potential based on written data is held by keeping the non-conducting state. Thus, it is particularly preferable to use a transistor with a low off-state current as a switch for suppressing change in the potential in the floating node FN which is accompanied by the transfer of electrical charge.

When the transistor 111 has a low off-state current and be kept in an off state, the memory cell 100 can be a nonvolatile memory. Thus, once data is written to the memory cell 100, the data can be held in the floating node FN until the transistor 111 is turned on again.

Moreover, the OS transistor has the following advantages. The OS transistor can be formed with thin films or the like, which enables a structure of stacking OS transistors. The off-state current of the OS transistor is less likely to increase even at a high temperature, which enables a memory device including the memory cell 100 to have high reliability. The OS transistor can be manufactured using the same equipment as that for manufacturing transistors including silicon in channel formation regions, which enables low cost for manufacturing OS transistors.

The transistor 111 may include a back gate (also referred to as a second gate, a bottom gate, or the like). For example, in the case where the transistor 111 has a back gate, the threshold voltage of the transistor 111 can be increased and decreased by application of a predetermined potential to the back gate of the transistor 111. Alternatively, when the back gate of the transistor 111 is electrically connected to the gate (also referred to as a first gate, a top gate, or a front gate with respect to the back gate) of the transistor 111, the on-state current of the transistor 111 can be increased.

Specifically, the threshold voltage of the transistor 111 shifts in the negative direction when the level of potential applied to the back gate is increased, and the threshold voltage of the transistor 111 shifts in the positive direction when the level of potential applied to the back gate is decreased. By shifting the threshold voltage in the negative direction, the on-state current of the transistor can be increased, and the memory cell 100 can operate at high speed. By the shift of the threshold voltage in the positive direction, the off-state current of the transistor can be reduced, and the memory cell 100 can hold data for a long time.

Note that a transistor other than OS transistor may be used for the transistor 111. The transistor 111 is preferably a transistor with low off-state current, and for example, a transistor in which a semiconductor with a wide bandgap is included in a channel formation region can be used. The wide-bandgap semiconductor refers to a semiconductor whose bandgap is higher than or equal to 2.2 eV in some cases, and examples thereof include silicon carbide, gallium nitride, and diamond.

In the transistor 112, a current $I_d$ flows between the source and the drain in accordance with the potential of the floating node FN. Note that in the memory cell 100 shown in FIG. 3A, the current $I_d$ that flows between the source and the drain of the transistor 112 is a current that flows between the bit line BL and the power supply line SL. Note that the transistor 112 is also referred to as a second transistor. Furthermore, the transistor 112 is a p-channel transistor in the description.

The transistor 112 is preferably a transistor with small variation in threshold voltages. Here, the transistor with small variation in threshold voltages mean as follows: a plurality of transistors produced in the same process have an acceptable difference in threshold voltages of 20 mV or lower. For example, a transistor formed using a single crystal silicon substrate can be used as the transistor 112. It is needless to say that the variation in threshold voltage is preferably as small as possible; however, even the transistors using a single crystal silicon substrate may have a threshold voltage difference of approximately 20 mV.

In this specification and the like, a transistor formed on a single crystal silicon substrate is referred to as a "Si transistor". A channel region of the Si transistor is formed using single crystal silicon. When a Si transistor is used as the transistor 112 and an OS transistor is used as the transistor 111, the transistor 111 can be stacked over the single crystal silicon substrate where the transistor 112 is formed. In Embodiment 4, an example in which the transistor 111 is stacked over a single crystal silicon substrate is described.

<Memory Cell Structure Example 2>

Figure 4A:
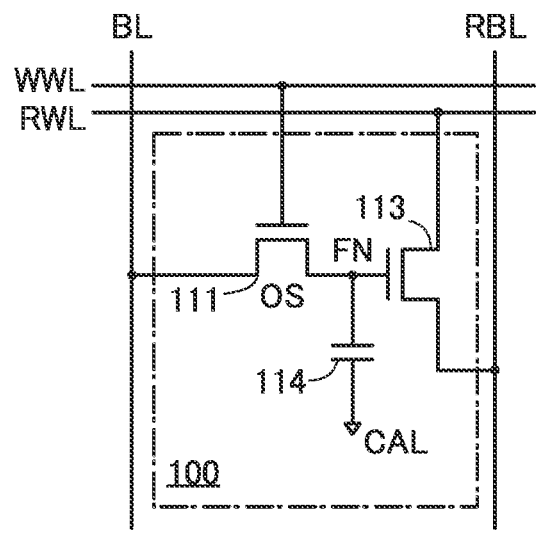
FIGS. 4A and 4B are each a circuit diagram illustrating a structure example of a memory cell.

The memory cell 100 may include the transistor 111, the capacitor 114, and an n-channel transistor 113. FIG. 4A illustrates a structure example in which the memory cell 100 includes the transistor 111, the capacitor 114, and the transistor 113.

A gate of the transistor 111 is connected to a write word line WWL. One of a source and a drain of the transistor 111 is connected to a bit line BL. The other of the source and the drain of the transistor 111 is connected to a floating node FN.

A gate of the transistor 113 is connected to the floating node FN. One of a source and a drain of the transistor 113 is connected to a read word line RWL. The other of the source and the drain of the transistor 113 is connected to a bit line RBL.

One electrode of the capacitor 114 is connected to the floating node FN. The other electrode of the capacitor 114 is connected to a wiring CAL to which a predetermined potential is supplied.

When the memory cell 100 has the structure shown in FIG. 4A, an OS transistor can be used as the transistor 113.

Figure 4B:
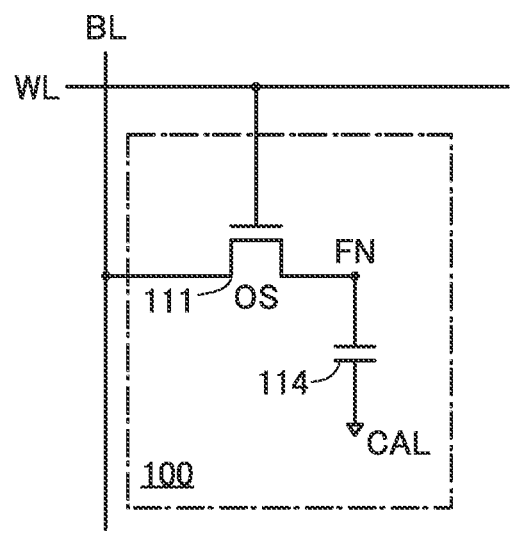

The memory cell 100 may have a structure composed of one OS transistor and one capacitor. FIG. 4B illustrates a structure example where the memory cell 100 is composed of the transistor 111 and the capacitor 114.

A gate of the transistor 111 is connected to a write word line WL. One of a source and a drain of the transistor 111 is connected to a bit line BL. The other of the source and the drain of the transistor 111 is connected to a floating node FN.

One electrode of the capacitor 114 is connected to the floating node FN. The other electrode of the capacitor 114 is connected to a wiring CAL to which a predetermined potential is supplied.

With the structure illustrated in FIG. 4B, high-density arrangement of the memory cells 100 can be achieved. Data reading is destructive read out.

<Operation Example of Memory Cell>

Next, operation of the memory cell 100 illustrated in FIG. 3A will be described.

Figure 3B:
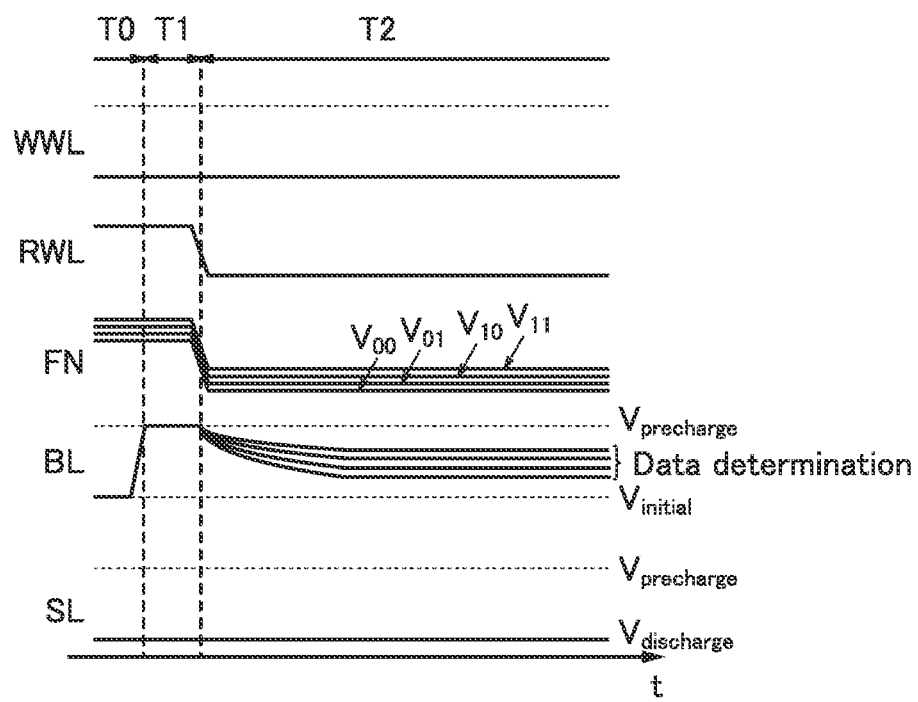
FIG. 3B is a timing chart showing an operation example of a memory cell.

FIG. 3B is a timing chart showing changes of signals supplied to the write word line WWL, the read word line RWL, the floating node FN, the bit line BL, and the power supply line SL in FIG. 3A.

The following periods are shown in the timing chart of FIG. 3B: a period T0 which is in an initial state; a period T1 in which the potential of the bit line BL is precharged; and a period T2 in which the electrical charge of the bit line BL is discharged to perform reading of data.

In the period T0 of FIG. 3B, the potential of the bit line BL is initialized. At this time, the write word line WWL is supplied with a low-level potential. The read word line RWL is supplied with a high-level potential. The floating node FN holds a potential corresponding to the multilevel data. The bit line BL is supplied with the initialization potential $V_{initial}$. The power supply line SL is supplied with the discharge potential $V_{discharge}$.

Note that as an example of the multilevel data, 2-bit data, i.e., 4-level data, is shown in FIG. 3B. Specifically, potentials corresponding to 4-level data ($V_{00}$, $V_{01}$, $V_{10}$, and $V_{11}$) are shown in FIG. 3B, and the data can be represented by four levels of potentials.

The memory device 270, for example, can hold the potentials corresponding to 4-level data ($V_{00}$, $V_{01}$, $V_{10}$, and $V_{11}$) in the operation mode 2 and can store data using two ($V_{00}$ and $V_{11}$) out of the potentials corresponding to 4-level data in the operation mode 1. The potential difference between $V_{00}$ and $V_{11}$ is larger than that between $V_{00}$ and $V_{01}$, for example; thus, the operation mode 1 can hold data, which is stored without power supply, for a longer time than the operation mode 2.

Next, in the period T1 of FIG. 3B, the potential of the bit line BL is precharged. At this time, the write word line WWL is supplied with the low-level potential as in the previous period. The read word line RWL is supplied with the high-level potential as in the previous period. At the floating node FN, the potential corresponding to the multilevel data is held as in the previous period. The bit line BL is supplied with a precharge potential $V_{precharge}$. The power supply line SL is supplied with the low-level potential, which is lower than the precharge potential $V_{precharge}$, as in the previous period.

In this point, the bit line BL is brought into an electrically floating state after the precharge potential $V_{precharge}$ is supplied. That is, the bit line BL is brought into a state in which the potential is changed by the charging or discharging of electrical charge. By turning off a switch for supplying a potential to the bit line BL, the bit line BL can be brought into an electrically floating state.

Next, in the period T2 of FIG. 3B, the electrical charge of the bit line BL is discharged to perform data reading. At this time, the write word line WWL is supplied with the low-level potential as in the previous period. The read word line RWL is supplied with a low-level potential. In the floating node FN, each of the potentials corresponding to the multilevel data is lowered. In the bit line BL, the potential is lowered from the precharge voltage $V_{precharge}$ in accordance with the potential of the floating node FN. The power supply line SL is supplied with the discharge potential $V_{discharge}$ as in the previous period.

The potential of the floating node FN is lowered in accordance with the change in the potential of the read word line RWL. The lowering of the potential is derived from the electrically floating state of the floating node FN and is caused by capacitive coupling due to the capacitor 114 connected to the floating node FN.

The lowering of the floating node FN leads to a decrease in the potential of the gate of the transistor 112. The transistor 112 is a p-channel transistor, and the absolute value of a voltage between the gate and the source (gate-source voltage: $V_{gs}$) is increased as the potential of the gate is lowered. With the increase in $V_{gs}$, the current $I_d$ flows between the source and the drain of the transistor 112.

When the current $I_d$ flows in the transistor 112, the electrical charge of the bit line BL is discharged to the power supply line SL. The potential of the bit line BL corresponding to that of the source of the transistor 112 is lowered by the discharging. The lowering of the potential of the bit line BL leads to a gradual decrease in $V_{gs}$ of the transistor 112.

When $V_{gs}$ reaches the threshold voltage of the transistor 112, the current $I_d$ that flows in the period T2 stops flowing. Hence, the lowering of the potential of the bit line BL proceeds, and when $V_{gs}$ of the transistor 112 reaches the threshold voltage, the discharging is completed and the bit line BL has a constant potential. The potential of the bit line BL at this time is approximately a value obtained by subtracting the threshold voltage from the potential of the floating node FN.

That is, the potential of the floating node FN can be reflected in the potential of the bit line BL which is changed by the discharging. The difference in the potential is used to determine the multilevel data. In this manner, the multilevel data written to the memory cell 100 can be read.

In this embodiment, the multilevel data can be read from the memory cell without switching a signal for reading data in accordance with the number of levels of the multilevel data.

The structures described in this embodiment can be combined as appropriate with any of the structures described in the other embodiments.

Embodiment 3

In this embodiment, a structure example and an operation example of the memory device 270 will be described. The memory device 270 is an example of a memory device which can employ the driving method described in Embodiment 2 and includes the memory cell 100 illustrated in FIG. 3A.

<Structure Example of Memory Device>

Figure 5:
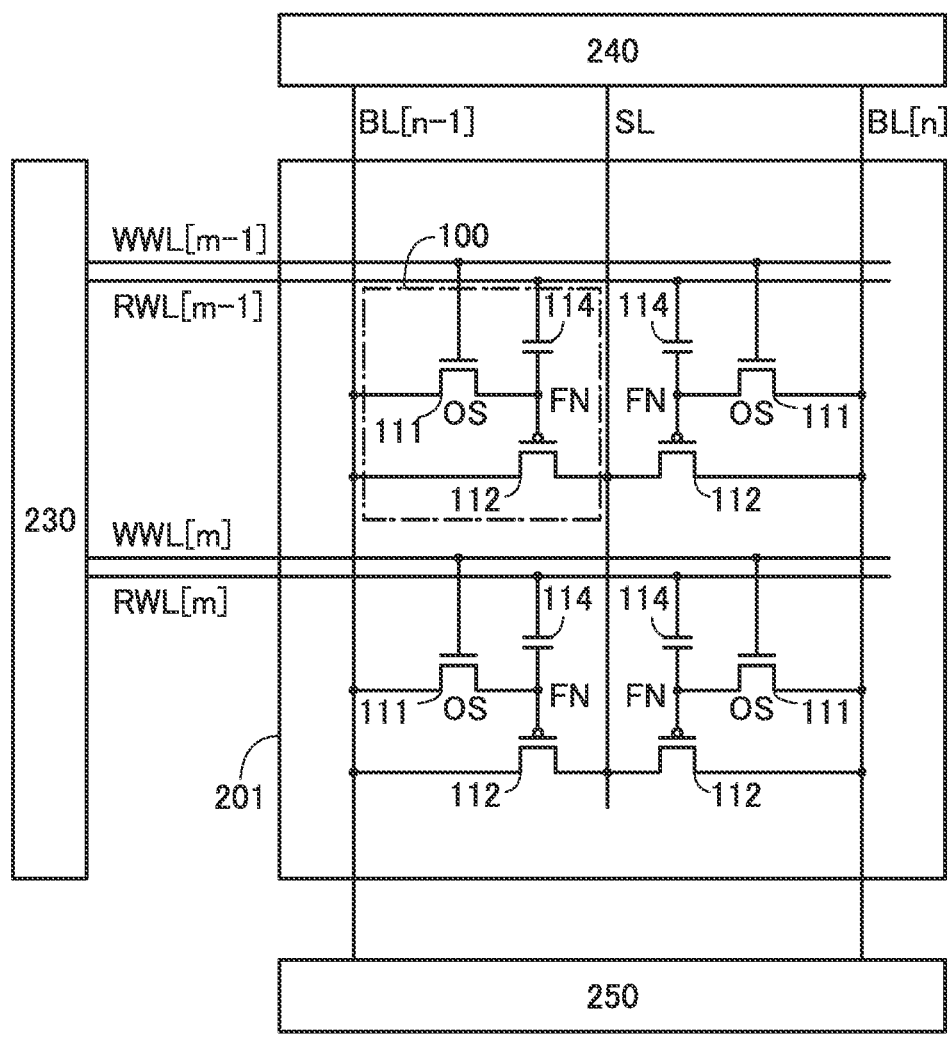
FIG. 5 is a block diagram illustrating a structure example of a memory device.

FIG. 5 is a block diagram illustrating a structure example of the memory device 270.

The memory device 270 illustrated in FIG. 5 includes a memory cell array 201 provided with a plurality of the memory cells 100 shown in FIG. 3A, a row selection driver 230, a column selection driver 240, and an A/D converter 250. The memory device 270 includes the memory cells 100 arranged in a matrix of m rows and n columns (m and n are each an integer greater than or equal to 2). In addition, in FIG. 5, a write word line WWL[m−1] and a read word line RWL[m−1] for an (m−1)-th row, a write word line WWL[m] and a read word line RWL[m] for an m-th row, a bit line BL[n−1] for an (n−1)th column, a bit line BL[n] for an nth column, and a power supply line SL are shown as write word lines WWL, read word lines RWL, a bit line BL, and a power supply line SL.

In the memory cell array 201 shown in FIG. 5, the memory cells 100 illustrated in FIG. 3A are arranged in a matrix. Note that components of the memory cells 100 are similar to the components of the memory cell shown in FIG. 3A; thus, the description of the components is omitted and the description of FIGS. 3A and 3B can be referred to.

Note that the memory cell array 201 shown in FIG. 5 has a configuration in which the power supply line SL is shared by adjacent memory cells. With such a configuration, the area occupied by the power supply line SL is reduced. Thus, a memory device with this structure can have high storage capacity per unit area.

The row selection driver 230 is a circuit which has functions of selectively turning on the transistors 111 in each row of the memory cells 100 and selectively changing the potential of the floating node FN in each row of the memory cells 100. Specifically, the row selection driver 230 is a circuit which supplies a write signal to the write word line WWL and supplies a read word signal to the read word line RWL. With the row selection driver 230, the memory cells 100 can be selected row by row, and data can be written and read to/from the selected memory cells 100 in the memory device 270.

The column selection driver 240 is a circuit having a function of writing data to the floating node FN in each column of the memory cell 100 in a selective manner, precharging the potential of the bit line BL, initializing the potential of the bit line BL, and bringing the bit line BL into an electrically floating state. Specifically, the column selection driver 240 is a circuit which supplies a potential corresponding to multilevel data to the bit line BL and supplies a precharge potential $V_{precharge}$ and an initialization potential $V_{initial}$ to the bit line BL through a switch. The column selection driver 240 in the memory device 270 allows the memory cells 100 to be selected column by column and data to be written and read to/from the selected memory cells 100.

The A/D converter 250 is a circuit having a function of converting the potential of the bit line BL that is an analog value into a digital value and outputting the digital value to the outside. Specifically, the A/D converter 250 includes a flash AD/converter. The A/D converter 250 enables the memory device 270 to output, to the outside, the potential of the bit line BL that corresponds to data read from the memory cell 100.

Note that the A/D converter 250 is regarded as a flash A/D converter. However, the A/D converter 250 may be a successive approximation A/D converter, a multi-slope A/D converter, or a delta-sigma A/D converter.

<Structure Example of Row Decoder>

Figure 6:
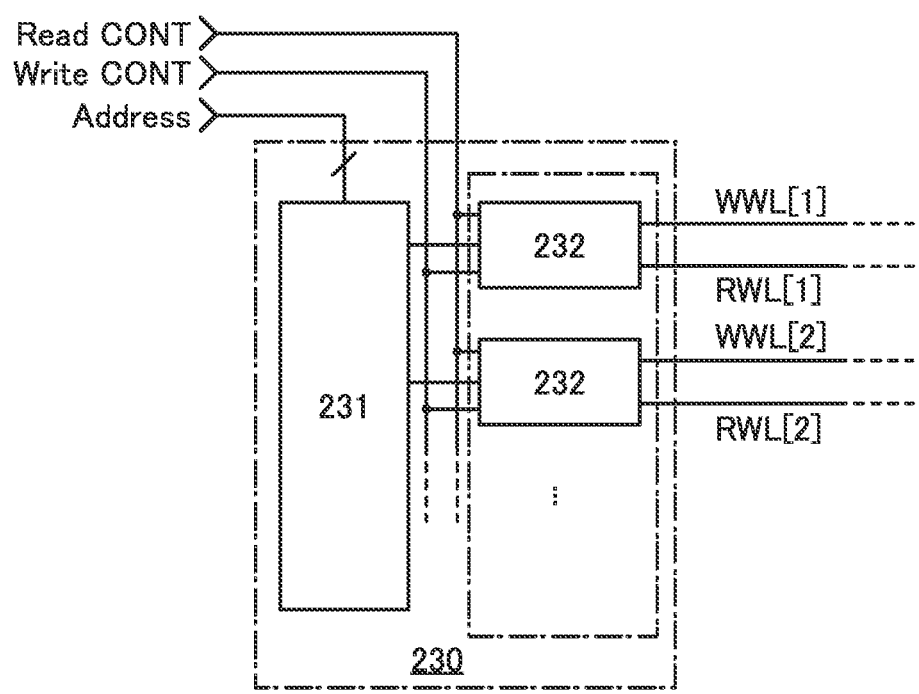
FIG. 6 is a block diagram illustrating a structure example of a row selection driver.

FIG. 6 is a block diagram showing a structure example of the row selection driver 230 illustrated in FIG. 5.

The row selection driver 230 shown in FIG. 6 includes a decoder 231 and read/write controllers 232. The read/write controller 232 is provided for every row of the write word line WWL and the read word line RWL. Further, the read/write controller 232 of each row is connected to the write word line WWL and the read word line RWL.

The decoder 231 is a circuit having a function of outputting a signal for selecting a row provided with the write word line WWL and the read word line RWL. Specifically, the decoder 231 is a circuit which receives an address signal (Address) and selects the read/write controller 232 of any of rows in accordance with the Address. With the decoder 231, the row selection driver 230 can select a given row to write or read data.

The read/write controller 232 is a circuit having a function of outputting a write word signal and outputting a read word signal in a selective manner, in a row including the write word line WWL and the read word line RWL which are selected by the decoder 231. Specifically, the read/write controller 232 is a circuit which receives a write control signal Write_CONT and a read control signal Read_CONT and outputs a write word signal or a read word signal in accordance with the signal in a selective manner. With the read/write controllers 232, the row driver 230 can select and output the write word signal or the read word signal in the row selected by the decoder 231.

<Structure Example of Column Decoder>

Figure 7:
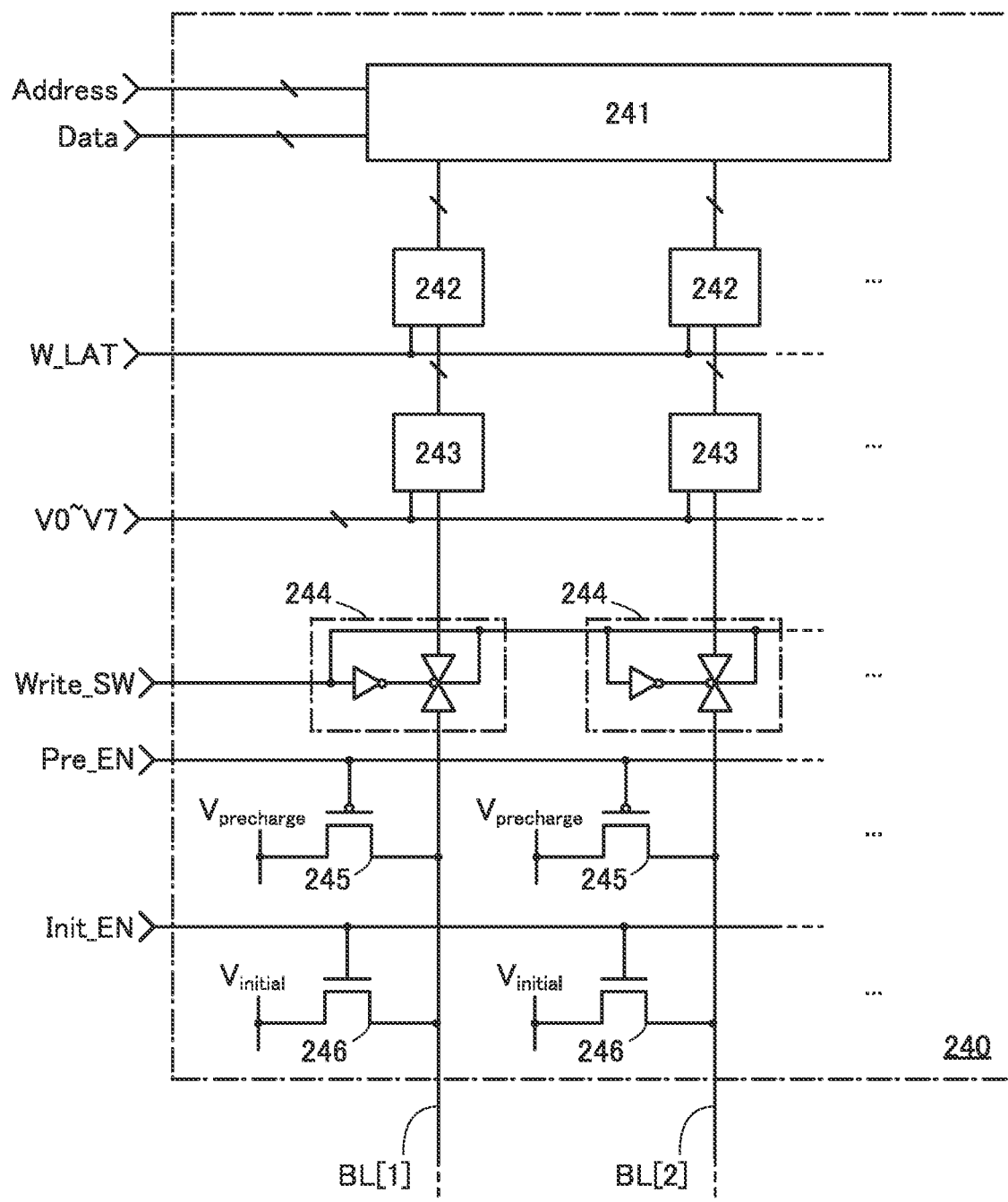
FIG. 7 is a block diagram illustrating a structure example of a column selection driver.

FIG. 7 is a block diagram showing a structure example of the column selection driver 240 illustrated in FIG. 5.

The column selection driver 240 illustrated in FIG. 7 includes a decoder 241, a latch circuit 242, a D/A converter 243, a switch circuit 244, a transistor 245, and a transistor 246. These circuits and transistors are provided in each column. Further, the switch circuit 244, the transistor 245, and the transistor 246 of each column are connected to the bit line BL.

The decoder 241 is a circuit having a function of selecting a column of the bit line BL and sorting and outputting input data. Specifically, the decoder 241 receives an address signal Address and data Data and outputs the data Data to the latch circuit 242 of any of columns in accordance with the address signal Address. The decoder 241 allows the column selection driver 240 to select a given column and write data.

Note that the data Data input to the decoder 241 is k-bit digital data. The k-bit digital data is a signal represented by binary data of '1' or '0' for each bit. Specifically, 2-bit digital data is data represented by '00', '01', '10', and '11'.

The latch circuit 242 has a function of temporarily storing the input data Data. Specifically, the latch circuit 242 is a flip-flop circuit that receives a latch signal W_LAT, stores the data Data, and outputs the data Data to the D/A converter 243 in accordance with the latch signal W_LAT. The latch circuit 242 enables the column selection driver 240 to write data at an opportune time.

The D/A converter 243 is a circuit having a function of converting input digital data Data into analog data $V_{data}$. Specifically, the D/A converter 243 converts 3-bit data Data, for example, into one of eight potentials (V0 to V7) and outputs the potential to the switch circuit 244. The D/A converter 243 allows the column selection driver 240 to convert data written to the memory cell 100 into a potential corresponding to multilevel data.

Note that the data $V_{data}$ output from the D/A converter 243 can be represented by different potential levels. In the case of 2-bit data, the $V_{data}$ has four values of, for example, 0.5 V, 1.0 V, 1.5 V, and 2.0 V and can be represented by one of the potential values.

The switch circuit 244 is a circuit having a function of supplying input data $V_{data}$ to the bit line BL and bringing the bit line BL into an electrically floating state. Specifically, the switch circuit 244 includes an analog switch and an inverter. The switch circuit 244 supplies the data $V_{data}$ to the bit line BL in accordance with a switch control signal Write_SW, and then makes the bit line BL electrically floating by turning off the analog switch. The switch circuit 244 enables the column selection driver 240 to keep the bit line BL in an electrically floating state after the data $V_{data}$ is supplied to the bit line BL.

The transistor 245 is a circuit component having a function of supplying a precharge potential $V_{precharge}$ to the bit line BL and bringing the bit line BL into an electrically floating state. Specifically, the transistor 245 is a switch which, in accordance with a precharge control signal Pre_EN, supplies a precharge potential $V_{precharge}$ to the bit line BL and then brings the bit line BL into an electrically floating state. The transistor 245 enables the column selection driver 240 to keep the bit line BL in an electrically floating state after the precharge potential $V_{precharge}$ is supplied to the bit line BL.

The transistor 246 is a circuit component having a function of supplying an initialization potential $V_{initial}$ to the bit line BL and bringing the bit line BL into an electrically floating state. Specifically, the transistor 246 is a switch that supplies an initialization potential $V_{initial}$ to the bit line BL in accordance with an initialization control signal Init_EN, and then brings the bit line BL into an electrically floating state. The transistor 246 enables the column selection driver 240 to keep the bit line BL in an electrically floating state after the initialization potential $V_{initial}$ is supplied to the bit line BL.

<Structure Example of A/D Converter>

Figure 8:
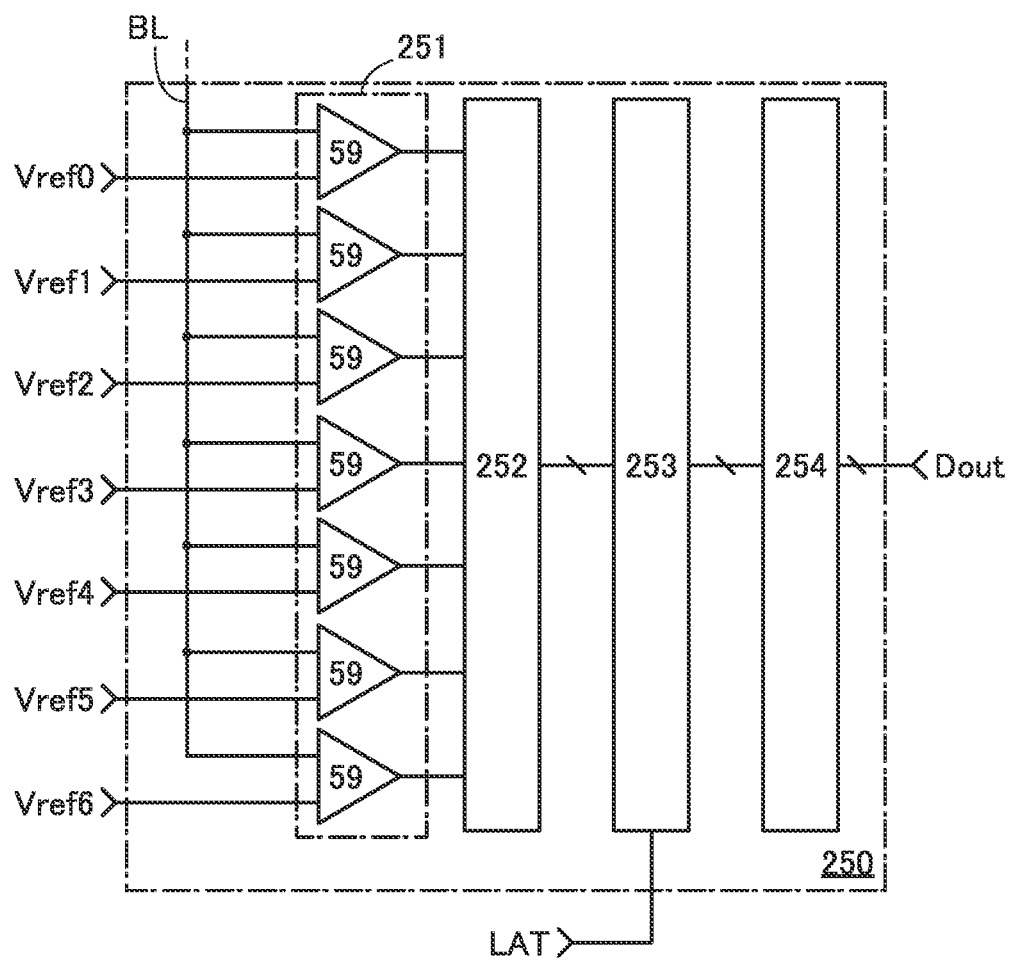
FIG. 8 is a block diagram illustrating a structure example of an A/D converter.

FIG. 8 is a block diagram illustrating a structure example of the A/D converter 250 shown in FIG. 5.

The A/D converter 250 illustrated in FIG. 8 includes a comparator circuit 251, an encoder 252, a latch circuit 253, and a buffer 254. These circuits and transistors are provided in each column. The buffer 254 in each column outputs data Dout.

The comparator circuit 251 is a circuit having a function of determining which of the levels of multilevel data the potential of the bit line BL corresponds to, by comparing the levels of the potential of the bit line BL and the potentials of reference voltages $V_{ref0}$ to $V_{ref6}$. Specifically, the comparator circuit 251 includes a plurality of comparators 59 to which the potential of the bit line BL and a corresponding one of the reference voltages $V_{ref0}$ to $V_{ref6}$ are supplied, and determines which of two potentials among the reference voltages $V_{ref0}$ to $V_{ref6}$ the potential of the bit line BL is between. With the comparator circuit 251, the A/D converter 250 can determine which of the levels of the multilevel data the potential of the bit line BL corresponds to.

Note that the reference voltages $V_{ref0}$ to $V_{ref6}$ shown in FIG. 8 as an example are potentials that are supplied when multilevel data is 3-bit data, that is, 8-level data.

The encoder 252 is a circuit having a function of generating a multi-bit digital signal based on a signal for determining the potential of the bit line BL that is output from the comparator circuit 251. Specifically, the encoder 252 is a circuit which encodes a H-level or L-level signal output from the plurality of comparators 59 to generate a digital signal. With the encoder 252, the A/D converter 250 can change data read from the memory cell 100 into digital data.

The latch circuit 253 has a function of temporarily storing input digital data. Specifically, the latch circuit 253 is a flip-flop circuit that receives a latch signal LAT, stores data, and outputs the data to the buffer 254 in accordance with the latch signal LAT. With the latch circuit 253, the A/D converter 250 can output data at an opportune time. Note that the latch circuit 253 can be omitted.

The buffer 254 is a circuit having a function of amplifying data output from the latch circuit 253 and outputting the amplified data as an output signal Dout. Specifically, the buffer 254 is a circuit which includes an even number of stages of inverter circuits. The buffer 254 allows the A/D converter 250 to reduce noise of a digital signal. Note that the buffer 254 can be omitted.

<Specific Example of Driving Method of Memory Device>

Figure 9:
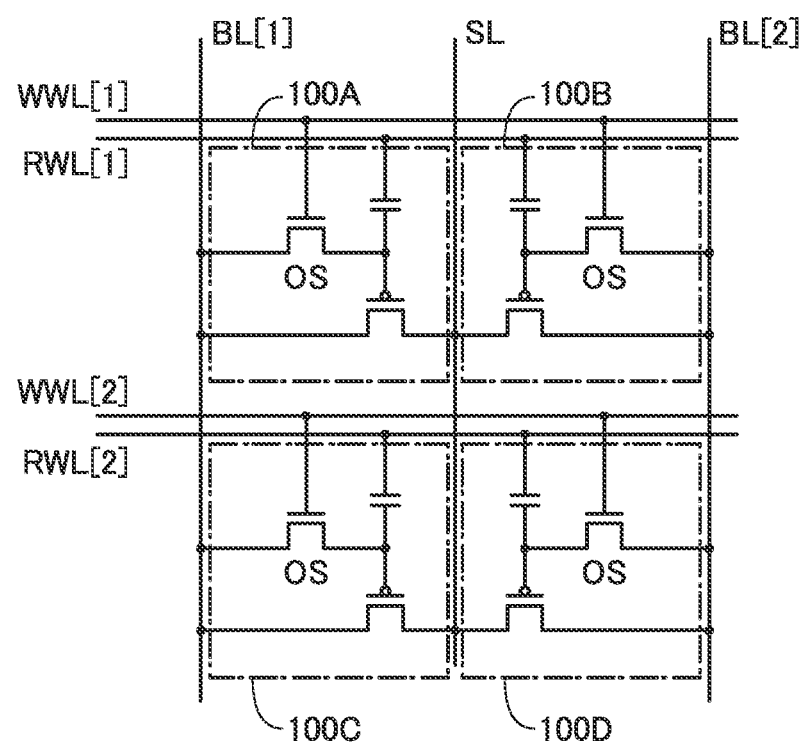
FIG. 9 is a circuit diagram of a memory cell included in a memory device.

FIG. 9 is a circuit diagram of a memory cell included in the memory device 270. Timing charts in FIG. 10 and FIG. 11 show operation of the memory cell in FIG. 9.

As the memory cells shown in FIG. 9, memory cells 100A to 100D having the same structure as the memory cell 100 in FIG. 3A are arranged in a matrix of two rows and two columns. Furthermore, in FIG. 9, a write word line WWL[1] and a read word line RWL[1] for a first row, a write word line WWL[2] and a read word line RWL[2] for a second row, a bit line BL[1] for a first column, a bit line BL[2] for a second column, and a power supply line SL are shown as write word lines WWL, read word lines RWL, bit lines BL, and a power supply line SL.

Figure 10:
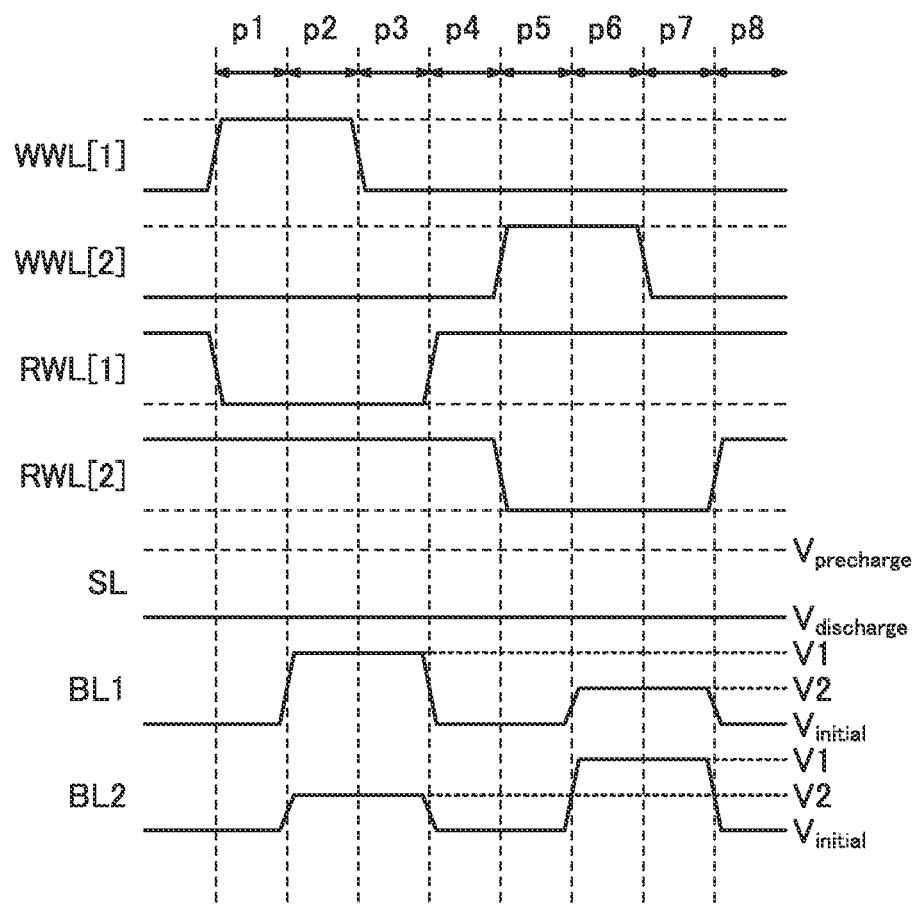
FIG. 10 is a timing chart showing an operation example of a memory cell.
Figure 11:
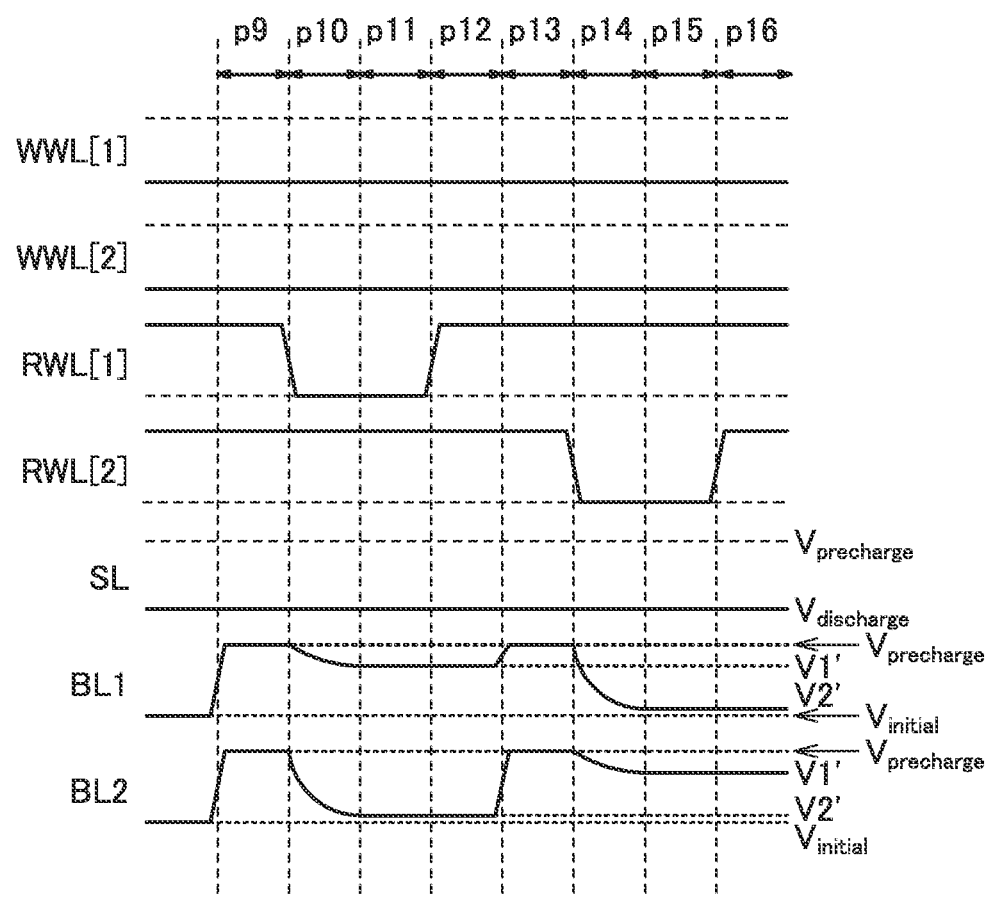
FIG. 11 is a timing chart showing an operation example of a memory cell.

FIG. 10 shows the timing chart from periods p1 to p8 during which data is written. FIG. 11 shows the timing chart from periods p9 to p16 during which data is read. FIG. 10 and FIG. 11 show changes in potentials of the write word line WWL[1], the write word line WWL[2], the read word line RWL[1], the read word line RWL[2], the power supply line SL, the bit line BL[1], and the bit line BL[2] shown in FIG. 9.

In the period p1 shown in FIG. 10, the write word line WWL[1] is set at H level and the read word line RWL[1] is set at L level. Note that the other wirings, i.e., the write word line WWL[2], the read word line RWL[2], the power supply line SL, the bit line BL[1], and the bit line BL[2] hold potentials in the previous period.

Next, in the period p2 shown in FIG. 10, the potential of the bit line BL[1] is set to V1, and the potential of the bit line BL[2] is set to V2. Note that the other wirings, i.e., the write word line WWL[1], the write word line WWL[2], the read word line RWL[1], the read word line RWL[2], and the power supply line SL hold potentials in the previous period.

Next, in the period p3 shown in FIG. 10, the write word line WWL[1] is set at L level. Note that the other wirings, i.e., the write word line WWL[2], the read word line RWL[1], the read word line RWL[2], the power supply line SL, the bit line BL[1], and the bit line BL[2] hold potentials in the previous period.

The read word line RWL[1] is set at L level in the periods p1 to p3 in order to prevent data written to the memory cell from turning the transistor 112 on. The read word line RWL[1] is set at L level when data is written to the memory cell, which enables the read word line RWL[1] to be switched to have H level after the data is written to the memory cell. With such a structure, a malfunction of turning the p-channel transistor 112 on by an increase in the potential of the floating node FN in the memory cell can be inhibited after data is once written to the memory cell.

In the period p4 shown in FIG. 10, the read word line RWL[1] is set at H level. The potentials of the bit line BL[1] and the bit line BL[2] are each set to the initialization potential $V_{initial}$. Note that the other wirings, i.e., the write word line WWL[1], the write word line WWL[2], the read word line RWL[2], and the power supply line SL hold potentials in the previous period.

Next, the period p5 shown in FIG. 10, the write word line WWL[2] is set at H level and the read word line RWL[2] is set at L level. Note that the other wirings, i.e., the write word line WWL[1], the read word line RWL[1], the power supply line SL, the bit line BL[1], and the bit line BL[2] hold potentials in the previous period.

In the period p6 shown in FIG. 10, the potential of the bit line BL[1] is set to V2 and the potential of the bit line BL[2] is set to $V_1$. Note that the other wirings, i.e., the write word line WWL[1], the write word line WWL[2], the read word line RWL[1], the read word line RWL[2], and the power supply line SL hold potentials in the previous period.

In the period p7 shown in FIG. 10, the write word line WWL[2] is set at L level. Note that the other wirings, i.e., the write word line WWL[1], the read word line RWL[1], the read word line RWL[2], the power supply line SL, the bit line BL[1], and the bit line BL[2] hold potentials in the previous period.

The read word line RWL[2] is set at L level in the periods p5 to p7 in order to prevent data written into the memory cell from turning the transistor 112 on. The read word line RWL[2] is set at L level when data is written to the memory cell, which enables the read word line RWL[2] to be switched to have H level after the data is written to the memory cell. With such a structure, a malfunction of turning the p-channel transistor 112 on by an increase in the potential of the floating node FN in the memory cell can be inhibited after the data is once written to the memory cell.

Next, in the period p8 shown in FIG. 10, the read word line RWL[2] is set at H level. The potentials of the bit line BL[1] and the bit line BL[2] are each set to the initialization potential $V_{initial}$. Note that the other wirings, i.e., the write word line WWL[1], the write word line WWL[2], the read word line RWL[1], and the power supply line SL hold potentials in the previous period.

As described above, by performing the data writing shown in the periods p1 to p8, data corresponding to the potential $V_1$ is written to the memory cell 100A shown in FIG. 9, data corresponding to the potential $V_2$ is written to the memory cell 100B, data corresponding to the potential $V_2$ is written to the memory cell 100C, and data corresponding to the potential $V_1$ is written to the memory cell 100D.

In the period p9 shown FIG. 11, the bit line BL[1] and the bit line BL[2] are each set to have the precharge potential $V_{precharge}$. Note that the other wirings, i.e., the write word line WWL[1], the write word line WWL[2], the read word line RWL[1], the read word line RWL[2], and the power supply line SL hold potentials in the previous period.

Next, in the period p10 shown in FIG. 11, the read word line RWL[1] is set at L level. Thus, the potentials of the bit lines BL[1] and BL[2] are decreased in accordance with the potentials corresponding to the data written to the memory cell 100A and the memory cell 100B. Note that the other wirings, i.e., the write word line WWL[1], the write word line WWL[2], the read word line RWL[2], and the power supply line SL hold potentials in the previous period.

Next, in the period p11 shown in FIG. 11, a decrease in the potentials, which occurs in the period p10, stops, and the potentials of the bit line BL[1] and the bit line BL[2] are respectively a potential $V_{1'}$ and a potential $V_{2'}$. Note that the other wirings, i.e., the write word line WWL[1], the write word line WWL[2], the read word line RWL[1], the read word line RWL[2], and the power supply line SL hold potentials in the previous period.

Note that the voltage $V_{1'}$ and the voltage $V_{2'}$ correspond to the voltage $V_1$ and the voltage $V_2$ which are written to the memory cell 100A and the memory cell 100B, respectively, in FIG. 10.

Next, in the period p12 shown in FIG. 11, the read word line RWL[1] is set at H level. Note that the other wirings, i.e., the write word line WWL[1], the write word line WWL[2], the read word line RWL[2], the power supply line SL, the bit line BL[1], and the bit line BL[2] hold potentials in the previous period.

In the period p13 shown in FIG. 11, the bit line BL[1] and the bit line BL[2] are each set to have the precharge potential $V_{precharge}$. Note that the other wirings, i.e., the write word line WWL[1], the write word line WWL[2], the read word line RWL[1], the read word line RWL[2], and the power supply line SL hold potentials in the previous period.

Next, in the period p14 shown in FIG. 11, the read word line RWL[2] is set at L level. Thus, the potentials of the bit line BL[1] and the bit line BL[2] are decreased in accordance with the potentials corresponding to the data written to the memory cell 100C and the memory cell 100D. Note that the other wirings, i.e., the write word line WWL[1], the write word line WWL[2], the read word line RWL[1], and the power supply line SL hold potentials in the previous period.

Next, in the period p15 shown in FIG. 11, a decrease in the potentials, which occurs in the period p14, stops, and the potentials of the bit line BL[1] and the bit line BL[2] are respectively, the potential $V_{2'}$ and the potential $V_{1'}$. Note that the other wirings, i.e., the write word line WWL[1], the write word line WWL[2], the read word line RWL[1], the read word line RWL[2], and the power supply line SL hold potentials in the previous period.

Note that the voltage $V_{2'}$ and the voltage $V_{1'}$ correspond to the voltage $V_2$ and the voltage $V_1$ which are written to the memory cell 100C and the memory cell 100D, respectively, in FIG. 10.

Next, in the period p16 shown in FIG. 11, the read word line RWL[2] is set at the H level. Note that the other wirings, i.e., the write word line WWL[1], the write word line WWL[2], the read word line RWL[1], the power supply line SL, the bit line BL[1], and the bit line BL[2] hold potentials in the previous period.

As described above, by performing the data reading illustrated in the periods p9 to p16, data corresponding to the potential $V_1$ is read from the memory cell 100A shown in FIG. 9, data corresponding to the voltage $V_2$ is read from the memory cell 100B, data corresponding to the voltage $V_2$ is read from the memory cell 100C, and data corresponding to the voltage $V_1$ is read from the memory cell 100D.

As described above, with use of the structure and the operation of the memory device described in this embodiment, multilevel data can be read from the memory cell without switching a signal for reading data in accordance with the number of levels of the multilevel data.

The structures described in this embodiment can be combined as appropriate with any of the structures described in the other embodiments.

Embodiment 4

In this embodiment, a structure example of a transistor included in the memory device 270 described in the above embodiment will be described. The structure described in this embodiment has a layer including an OS transistor is stacked over a layer including a Si transistor formed on a single crystal silicon substrate.

<Structure Example of Memory Device>

Figure 12:
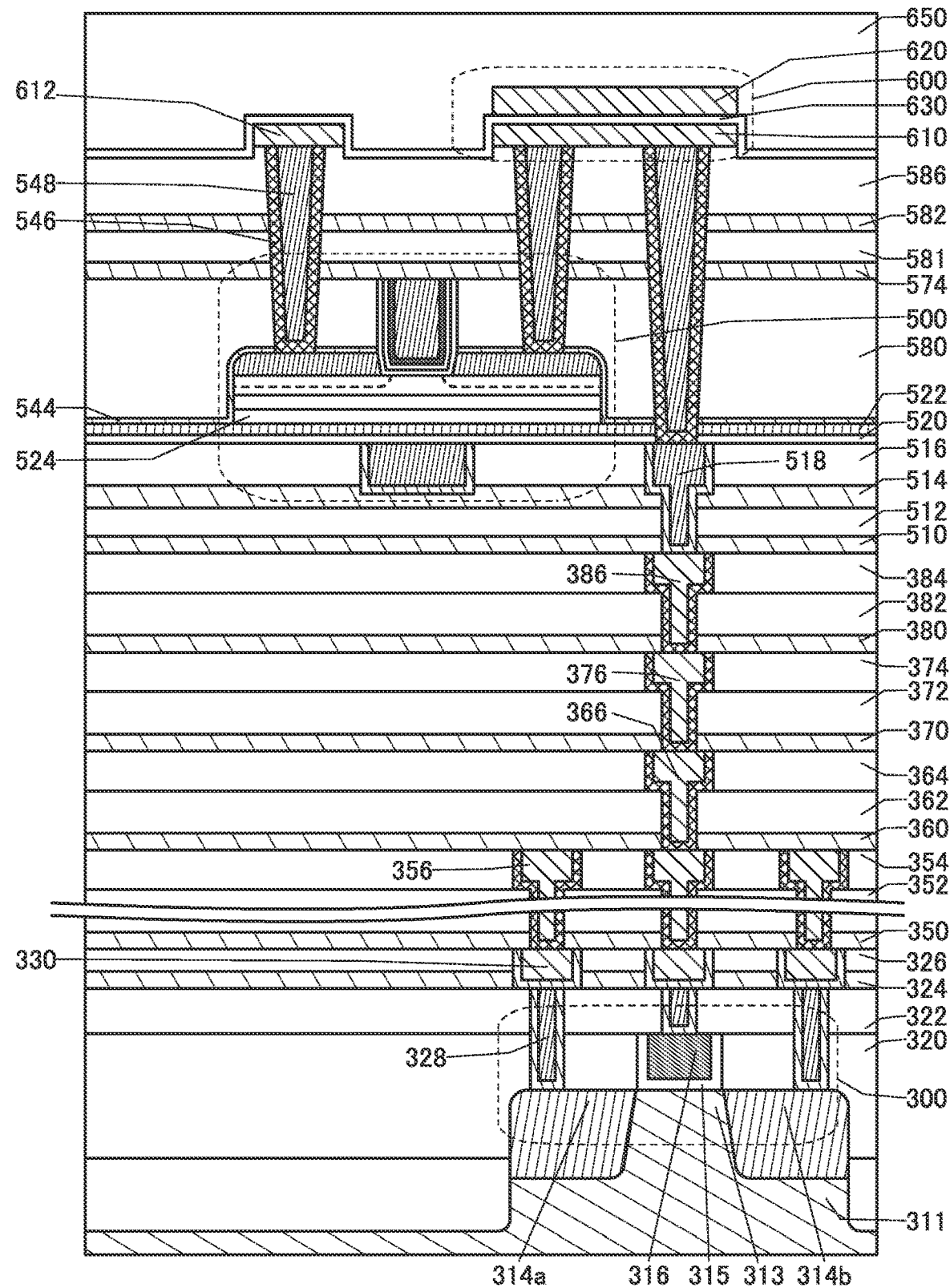
FIG. 12 is a cross-sectional view of a structure example of a memory device.
Figure 13A:
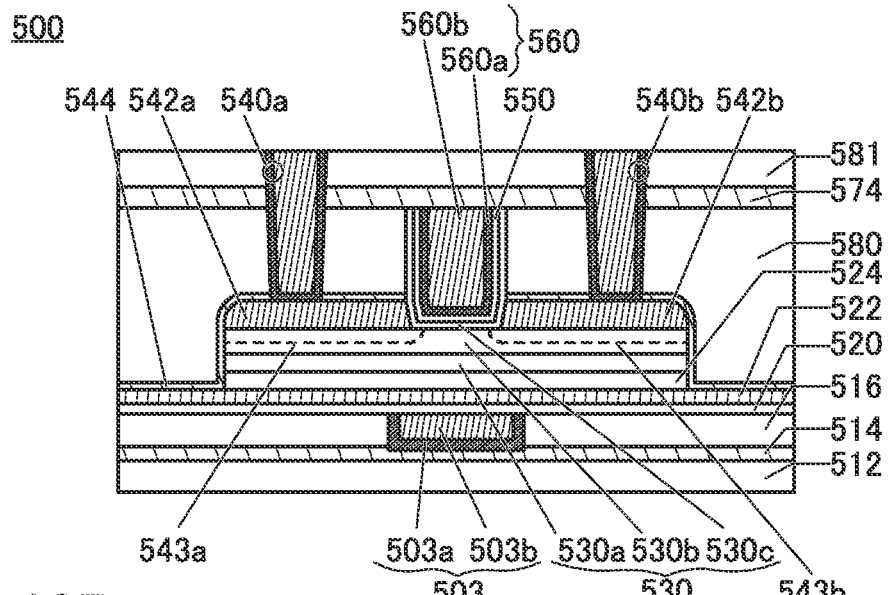
FIGS. 13A to 13C are cross-sectional views illustrating a structure example of a transistor.
Figure 13B:
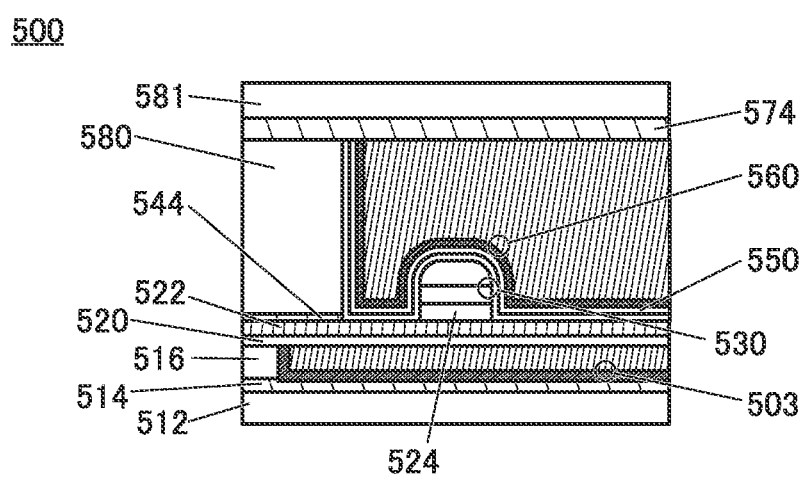
Figure 13C:
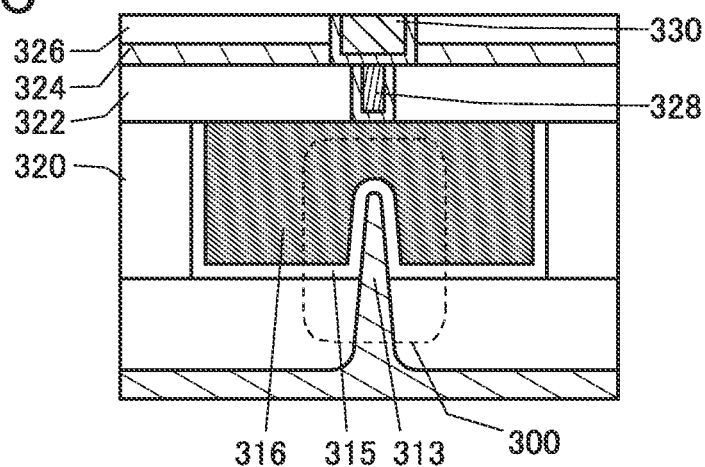

A memory device illustrated in FIG. 12 includes a transistor 300, a transistor 500, and a capacitor 600. FIG. 13A is a cross-sectional view of the transistor 500 in the channel length direction. FIG. 13B is a cross-sectional view of the transistor 500 in the channel width direction. FIG. 13C is a cross-sectional view of the transistor 300 in the channel width direction.

The transistor 500 corresponds to, for example, the transistor 111 described in the above embodiment, and the transistor 500 includes a first gate (also referred to as a top gate, a front gate, or simply a gate) and a second gate (also referred to as a bottom gate or a back gate). The transistor 300 corresponds to the transistor 112, and the capacitor 600 corresponds to the capacitor 114, for example.

The transistor 500 is a transistor including a metal oxide in its channel formation region (an OS transistor). Since the off-state current of the transistor 500 is extremely low, the memory device 270 in the above embodiment can hold data written to the memory cell 100 for a long time when the transistor 500 is used as the transistor 111.

As shown in FIG. 12, in the memory device described in this embodiment, the transistor 500 is provided above the transistor 300, and the capacitor 600 is provided above the transistor 300 and the transistor 500.

The transistor 300 is provided in and on a substrate 311 and includes a conductor 316, an insulator 315, a semiconductor region 313 that is part of the substrate 311, and a low-resistance region 314a and a low-resistance region 314b functioning as a source region and a drain region.

In the transistor 300, the top surface and the side surface in the channel width direction of the semiconductor region 313 are covered with the conductor 316 with the insulator 315 therebetween, as illustrated in FIG. 13C. Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material containing germanium (Ge), silicon germanium (SiGe), gallium arsenide (GaAs), gallium nitride (GaN), gallium aluminum arsenide (GaAlAs), or the like may be contained. Silicon whose effective mass is adjusted by applying stress to the crystal lattice and thereby changing the lattice spacing may be contained. Alternatively, a high electron mobility transistor (HEMT) may be employed as the transistor 300 with use of GaAs and GaAlAs or the like.

The low-resistance regions 314a and 314b contain an element that imparts n-type conductivity (e.g., arsenic or phosphorus) or an element that imparts p-type conductivity (e.g., boron), in addition to a semiconductor material used for the semiconductor region 313.

The conductor 316 functioning as a gate electrode can be formed using a semiconductor material, such as silicon, containing the element that imparts n-type conductivity (e.g., arsenic or phosphorus) or the element that imparts p-type conductivity (e.g., boron), or a conductive material such as a metal material, an alloy material, or a metal oxide material.

Note that since the work function of a conductor depends on a material of the conductor, the $V_{th}$ of a transistor can be adjusted by changing the material of the conductor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

Note that the transistor 300 illustrated in FIG. 12 is only an example and is not limited to having the structure shown therein; an appropriate transistor can be used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 are formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 300 or the like underlying the insulator 322. For example, a top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from the substrate 311, the transistor 300, or the like from diffusing to a region where the transistor 500 is provided.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that prevents hydrogen diffusion is preferably provided between the transistor 500 and the transistor 300. Specifically, the film that inhibits hydrogen diffusion is a film from which a small amount of hydrogen is released.

The amount of released hydrogen can be measured by thermal desorption spectroscopy (TDS) analysis, for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. The use of a material having a low dielectric constant for the interlayer film can reduce the parasitic capacitance between wirings.

A conductor 328, a conductor 330, and the like that are connected to the capacitor 600 or the transistor 500 are embedded in the insulators 320, 322, 324, and 326. Note that the conductor 328 and the conductor 330 each function as a plug or a wiring. A plurality of conductors functioning as plugs or wirings are collectively denoted by the same reference numeral in some cases. In this specification and the like, a wiring and a plug connected to the wiring may be a single component. That is, part of a conductor functions as a wiring in some cases, and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked in this order in FIG. 12. Furthermore, a conductor 356 is formed in the insulator 350, the insulator 352, and the insulator 354. The conductor 356 functions as a plug or a wiring that is connected to the transistor 300. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. With this structure, the transistor 300 and the transistor 500 can be separated by a barrier layer, so that the diffusion of hydrogen from the transistor 300 to the transistor 500 can be prevented.

Note that as the conductor having a barrier property against hydrogen, tantalum nitride is preferably used, for example. A stacked structure of tantalum nitride and tungsten having high conductivity can inhibit hydrogen diffusion from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 12, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to that for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. With this structure, the transistor 300 and the transistor 500 can be separated by a barrier layer, so that the diffusion of hydrogen from the transistor 300 to the transistor 500 can be prevented.

A wiring layer may be provided over the insulator 364 and the conductor 366. For example, in FIG. 12, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be formed using a material similar to that for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. With this structure, the transistor 300 and the transistor 500 can be separated by a barrier layer, so that the diffusion of hydrogen from the transistor 300 to the transistor 500 can be prevented.

A wiring layer may be provided over the insulator 374 and the conductor 376. For example, in FIG. 12, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be formed using a material similar to that for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. With this structure, the transistor 300 and the transistor 500 can be separated by a barrier layer, so that the diffusion of hydrogen from the transistor 300 to the transistor 500 can be prevented.

Although the wiring layer including the conductor 356, the wiring layer including the conductor 366, the wiring layer including the conductor 376, and the wiring layer including the conductor 386 are described above, the memory device of this embodiment is not limited thereto. The number of wiring layers similar to the wiring layer including the conductor 356 may be three or less, or five or more.

An insulator 510, an insulator 512, an insulator 514, and an insulator 516 are stacked sequentially over the insulator 384. A material having a barrier property against oxygen or hydrogen is preferably used for any of the insulator 510, the insulator 512, the insulator 514, and the insulator 516.

For example, each of the insulator 510 and the insulator 514 is preferably formed using a film having a barrier property that prevents hydrogen or impurities from the substrate 311, a region where the transistor 300 is provided, or the like from diffusing to a region where the transistor 500 is provided. Therefore, each of the insulator 510 and the insulator 514 can be formed using a material similar to that for the insulator 324.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that prevents hydrogen diffusion is preferably provided between the transistor 500 and the transistor 300. Specifically, the film that inhibits hydrogen diffusion is a film from which a small amount of hydrogen is released.

For the film having a barrier property against hydrogen used for each of the insulator 510 and the insulator 514, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

The insulator 512 and the insulator 516 can be formed using a material similar to that for the insulator 320, for example. An interlayer film with a relatively low dielectric constant can reduce the parasitic capacitance between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 functions as a plug or a wiring that is connected to the capacitor 600 or the transistor 300. The conductor 518 can be formed using a material similar to that for the conductor 328 and the conductor 330.

In particular, the conductor 518 in a region in contact with the insulator 510 and the insulator 514 is preferably a conductor having a barrier property against oxygen, hydrogen, and water. The structure can separate the transistor 300 and the transistor 500 by a layer having a barrier property against oxygen, hydrogen, and water. As a result, the diffusion of hydrogen from the transistor 300 to the transistor 500 can be inhibited.

The transistor 500 is provided over the insulator 516.

As illustrated in FIGS. 13A and 13B, the transistor 500 includes the conductor 503 embedded in the insulator 514 and the insulator 516; an insulator 520 over the insulator 516 and the conductor 503; an insulator 522 over the insulator 520, an insulator 524 over the insulator 522; an oxide 530a over the insulator 524; an oxide 530b over the oxide 530a; a conductor 542a and a conductor 542b apart from each other over the oxide 530b; an insulator 580 that is over the conductor 542a and the conductor 542b and has an opening between the conductor 542a and the conductor 542b; a conductor 560 in the opening; an insulator 550 that is positioned between the conductor 560 and the oxide 530b, the conductors 542a and 542b and the insulator 580; and an oxide 530c that is positioned between the insulator 550 and the oxide 530b, the conductors 542a and 542b and the insulator 580.

As illustrated in FIGS. 13A and 13B, an insulator 544 is preferably provided between the insulator 580 and the oxide 530a, the oxide 530b, the conductor 542a, and the conductor 542b. In addition, as illustrated in FIGS. 13A and 13B, the conductor 560 preferably includes a conductor 560a provided inside the insulator 550 and a conductor 560b embedded inside the conductor 560a. Moreover, as illustrated in FIGS. 13A and 13B, an insulator 574 is preferably provided over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542 in some cases.

The transistor 500 has, in the region where the channel is formed and its vicinity, a structure in which three layers of the oxide 530a, the oxide 530b, and the oxide 530c are stacked; however, the present invention is not limited thereto. For example, the transistor 500 may have a single-layer structure of the oxide 530b, a two-layer structure of the oxide 530b and the oxide 530a or 530c, or a stacked-layer structure of four or more layers. Although the conductor 560 has a two-layer structure in the transistor 500, the present invention is not limited thereto. For example, the conductor 560 may have a single-layer structure or a stacked-layer structure of three or more layers. Note that the structure of the transistor 500 is not limited to that in FIG. 12 and FIGS. 13A and 13B, which is only an example, and an appropriate transistor may be used in accordance with a circuit configuration or a driving method.

Here, the conductor 560 functions as a gate electrode of the transistor, and the conductor 542a and the conductor 542b function as a source electrode and a drain electrode. As described above, the conductor 560 is embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the footprint of the transistor 500. Accordingly, miniaturization and high integration of the memory device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance between the conductor 560 and the conductors 542a and 542b can be reduced. As a result, the transistor 500 can have increased switching speed and excellent frequency characteristics.

Here, the conductor 560 functions as a first gate electrode in some cases. The conductor 503 functions as a second gate electrode in some cases. In that case, by changing a potential applied to the conductor 503 independently of a potential applied to the conductor 560, $V_{th}$ of the transistor 500 can be controlled. In particular, when a negative potential is applied to the conductor 503, the $V_{th}$ of the transistor 500 becomes higher than 0 V to reduce the off-state current of the transistor. Thus, a drain current when a potential applied to the conductor 560 is 0 V can be smaller in the case where a negative potential is applied to the conductor 503 than in the case where the negative potential is not applied to the conductor 503.

The conductor 503 is provided to overlap with the oxide 530 and the conductor 560. Accordingly, in the case where potentials are applied to the conductor 560 and the conductor 503, an electric field generated from the conductor 560 and an electric field generated from the conductor 503 are connected, thereby covering the channel formation region in the oxide 530. In this specification and the like, a transistor structure in which the channel formation region is electrically surrounded by the electric fields of the first gate electrode and the second gate electrode is referred to as a surrounded channel (S-channel) structure.

Furthermore, in this specification and the like, the surrounded channel (S-channel) structure has a feature in that the side surface and the vicinity of the oxide 530 in contact with the conductor 542a and the conductor 542b functioning as a source electrode and a drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of the opening in the insulator 514 and the insulator 516, and a conductor 503b is formed inside the conductor 503a.

The insulator 520, the insulator 522, the insulator 524, and the insulator 550 function as a gate insulating film.

Here, an insulator containing oxygen more than that in the stoichiometric composition is preferably used as the insulator 524 in contact with the oxide 530. That is, an excess-oxygen region is preferably formed in the insulator 524. When such an insulator containing excess oxygen is provided in contact with the oxide 530, the amount of oxygen vacancies in the oxide 530 can be reduced, leading to an improvement in reliability of the transistor 500.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. In the TDS analysis, the film-surface temperature is preferably higher than or equal to 100° C. and lower than or equal to 700° C., or higher than or equal to 100° C. and lower than or equal to 400° C.

In the case where the insulator 524 includes an excess-oxygen region, the insulator 522 preferably has a function of inhibiting diffusion of oxygen (e.g., oxygen atoms and oxygen molecules). That is, it is preferable that oxygen be less likely to pass through the insulator 522.

The insulator 522 preferably has a function of inhibiting diffusion of oxygen or impurities, in which case diffusion of oxygen contained in the oxide 530 to the insulator 520 side is prevented. In addition, the conductor 503 can be inhibited from reacting with oxygen in the insulator 524 or the oxide 530.

The insulator 522 preferably has a single-layer structure or a stacked-layer structure using an insulator such as aluminum oxide, hafnium oxide, tantalum oxide, zirconium oxide, lead zirconate titanate (PZT), strontium titanate (SrTiO$_3$), or (Ba,Sr)TiO$_3$ (BST). With miniaturization and high integration of a transistor, a problem such as generation of leakage current sometimes arises because of a thin gate insulating film. When a high-k material is used for an insulator functioning as the gate insulating film, a gate potential at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like, i.e., an insulating material through which the above oxygen is less likely to pass. For the insulator containing an oxide of aluminum and/or an oxide of hafnium, aluminum oxide, hafnium oxide, an oxide containing aluminum and hafnium (hafnium aluminate), or the like is preferably used. The insulator 522 formed of such a material functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are preferred because of their thermal stability. Furthermore, combination of an insulator which is a high-k material and silicon oxide or silicon oxynitride enables the insulator 520 to have a stacked-layer structure that is thermally stable and has a high dielectric constant.

Note that the insulators 520, 522, and 524 may each have a stacked-layer structure of two or more layers. In that case, the stacked layers are not necessarily formed of the same material and may be formed of different materials.

In the transistor 500, a metal oxide functioning as an oxide semiconductor is preferably used as the oxide 530 including a channel formation region. For example, as the oxide 530, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Alternatively, an In—Ga oxide or an In—Zn oxide may be used as the oxide 530.

The metal oxide functioning as an oxide semiconductor may be formed by a sputtering method, an atomic layer deposition (ALD) method, or a chemical vapor deposition (CVD) method such as a metal organic chemical vapor deposition (MOCVD) method. Note that the metal oxide functioning as an oxide semiconductor will be described in detail in another embodiment.

Moreover, a metal oxide with low carrier density is preferably used for the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities contained in the metal oxide include hydrogen, nitrogen, alkali metal, alkaline earth metal, iron, nickel, and silicon.

Specifically, hydrogen contained in a metal oxide reacts with oxygen bonded to a metal atom to be water, and thus sometimes causes an oxygen vacancy in the metal oxide. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including a metal oxide that contains a large amount of hydrogen is likely to have normally-on characteristics.

A defect in which hydrogen enters an oxygen vacancy can serve as a donor of the metal oxide. However, it is difficult to evaluate the defects quantitatively. Thus, in the metal oxide, the defects are evaluated by carrier density, not by donor concentration. Accordingly, in this specification and the like, carrier density is sometimes used for a parameter of a metal oxide when an electric field is not applied, instead of donor concentration. Hence, "carrier density" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, further preferably lower than $1\times10^{16}$ cm$^{-3}$, further preferably lower than $1\times10^{13}$ cm$^{-3}$, further preferably lower than $1\times10^{12}$ cm$^{-3}$. Note that the lower limit of the carrier density of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen from the oxide 530 into the conductor 542 can be interpreted as absorption of oxygen in the oxide 530 by the conductor 542.

When oxygen in the oxide 530 is diffused into the conductor 542 (the conductors 542a and 542b), a layer is sometimes formed between the conductor 542a and the oxide 530b, and between the conductor 542b and the oxide 530b. The layer contains more oxygen than the conductor 542 does, so that the layer presumably has an insulating property. The three-layer structure of the conductor 542, the layer, and the oxide 530b can be the structure with a metal, an insulator, and a semiconductor, which is sometimes called a metal-insulator-semiconductor (MIS) structure or a diode junction structure having an MIS structure as its main part.

The above layer is not necessarily formed between the conductor 542 and the oxide 530b, but the layer may be formed between the conductor 542 and the oxide 530c, or layers are formed both between the conductor 542 and the oxide 530b, and the conductor 542 and the oxide 530c.

The metal oxide functioning as the channel formation region in the oxide 530 has a band gap of 2 eV or more, preferably 2.5 eV or more. The use of such a metal oxide having a wide band gap can reduce the off-state current of the transistor.

Note that semiconductor materials that can be used for the oxide 530 are not limited to the above metal oxides. A semiconductor material which has a band gap (a semiconductor material that is not a zero-gap semiconductor) can be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

In this specification and the like, the layered material is a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), zirconium selenide ($ZrSe_2$).

By including the oxide 530a under the oxide 530b, the oxide 530 can prevent impurities from diffusing into the oxide 530b from the components formed below the oxide 530a. By including the oxide 530c over the oxide 530b, the oxide 530 can prevent impurities from diffusing into the oxide 530b from the components formed above the oxide 530c.

The oxide 530 preferably has a stacked-layer structure of oxide layers which differ in the atomic ratio of metal atoms. Specifically, the atomic ratio of the element M to constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Moreover, the atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

The energy of the conduction band minimum of each of the oxide 530a and the oxide 530c is preferably higher than that of the oxide 530b. In other words, the electron affinity of each of the oxide 530a and the oxide 530c is preferably smaller than that of the oxide 530b.

Here, the energy level of the conduction band minimum is gradually varied at a junction portion of each of the oxides 530a, 530b, and 530c. In other words, the energy level of the conduction band minimum at a junction portion of each of the oxides 530a, 530b, and 530c is continuously varied or continuously connected. To vary the energy level gradually, the density of defect states in a mixed layer formed at the interface between the oxides 530a and 530b and the interface between the oxides 530b and 530c is preferably made low.

Specifically, when the oxides 530a and 530b or the oxides 530b and 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxides 530a and 530c.

At this time, the oxide 530b serves as a main carrier path. When the oxides 530a and 530c have the above structure, the density of defect states at the interface between the oxides 530a and 530b and the interface between the oxides 530b and 530c can be made low. Thus, the influence of interface scattering on carrier conduction is small, and the transistor 500 can have high on-state current.

The conductor 542 (the conductor 542a and the conductor 542b functioning as the source electrode and the drain electrode) is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 13A, a region 543 (a region 543a and a region 543b) is sometimes formed as low-resistance regions at and near the interface between the oxide 530 and the conductor 542. In that case, the region 543a functions as one of a source region and a drain region, and the region 543b functions as the other of the source region and the drain region. A channel formation region is formed in a region between the region 543a and the region 543b.

When the conductor 542 is provided in contact with the oxide 530, the oxygen concentration of the region 543 sometimes decreases. In addition, a metal compound layer that contains the metal contained in the conductor 542 and the component of the oxide 530 is sometimes formed in the region 543. In such a case, the region 543 has increased carrier density to be a low-resistance region.

The insulator 544 is provided to cover the conductor 542 and inhibits oxidation of the conductor 542. Here, the insulator 544 may be provided to cover the side surfaces of the oxide 530 and the insulator 524 and to be in contact with the insulator 522. Alternatively, the insulator 544 is not necessarily in contact with the insulator 522, and the insulator 524 may be provided between the insulator 522 and the insulator 544. In that case, the insulator 544 is provided to cover the side surface of the oxide 530 and to be in contact with the insulator 524.

A metal oxide containing one or more of hafnium, aluminum, gallium, yttrium, zirconium, tungsten, titanium, tantalum, nickel, germanium, magnesium, and the like can be used as the insulator 544. Alternatively, nitride oxide may be used as the insulator 544.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized by heat treatment in a later step. Therefore, it is preferable to use hafnium aluminate. Note that the insulator 544 is not necessarily provided when the conductor 542 is oxidation-resistant or does not significantly lose its conductivity even after absorbing oxygen. Design is determined as appropriate in consideration of required transistor characteristics.

The insulator 550 functions as a gate insulating film. The insulator 550 is preferably in contact with the inner side (the top surface and the side surface) of the oxide 530c. The insulator 550 is preferably formed using an insulator from which oxygen is released by heating. The insulator 550 is an oxide film of which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis, for example. In the TDS analysis, the film surface temperature is preferably higher than or equal to 100° C. and lower than or equal to 700° C.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen, can be used. In particular, silicon oxide and silicon oxynitride, which have thermal stability, are preferable.

When as the insulator 550, an insulator from which oxygen is released by heating is provided in contact with the top surface of the oxide 530c, oxygen can be effectively supplied from the insulator 550 to the channel formation region of the oxide 530b through the oxide 530c. As in the insulator 524, the concentration of impurities such as water and hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably prevents oxygen diffusion from the insulator 550 to the conductor 560. Providing the metal oxide that inhibits oxygen diffusion prevents diffusion of excess oxygen from the insulator 550 to the conductor 560. That is, a reduction in the amount of excess oxygen supplied to the oxide 530 can be suppressed. Moreover, oxidization of the conductor 560 due to excess oxygen can be suppressed. The metal oxide is formed using a material that can be used for the insulator 544.

Although the conductor 560 functioning as the first gate electrode has a two-layer structure in FIGS. 13A and 13B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom. Alternatively, the conductor 560a is preferably formed using a conductive material having a function of inhibiting diffusion of oxygen (e.g., at least one of oxygen atoms and oxygen molecules). When the conductor 560a has a function of inhibiting diffusion of oxygen, it is possible to prevent a reduction in conductivity of the conductor 560b due to oxidation of the conductor 560b caused by oxygen in the insulator 550. As a conductive material having a function of inhibiting diffusion of oxygen, for example, tantalum, tantalum nitride, ruthenium, or ruthenium oxide is preferably used.

Furthermore, the conductor 560*b* is preferably formed using a conductive material containing tungsten, copper, or aluminum as its main component. The conductor 560*b* also functions as a wiring and thus is preferably a conductor having high conductivity. For example, a conductive material containing tungsten, copper, or aluminum as its main component can be used. The conductor 560*b* may have a stacked-layer structure, for example, a stacked-layer structure of titanium, titanium nitride, and any of the above conductive materials.

The insulator 580 is provided over the conductor 542 with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable because of their thermal stability. Silicon oxide and porous silicon oxide are particularly preferable because an excess-oxygen region can be formed easily in a later step.

When the insulator 580 from which oxygen is released by heating is provided in contact with the oxide 530*c*, oxygen in the insulator 580 can be efficiently supplied to the oxide 530 through the oxide 530*c*. The concentration of impurities such as water and hydrogen in the insulator 580 is preferably lowered.

The opening of the insulator 580 is formed to overlap with a region between the conductor 542*a* and the conductor 542*b*. Thus, the conductor 560 is embedded in the opening of the insulator 580 and the region between the conductor 542*a* and the conductor 542*b*.

The gate length needs to be short for miniaturization of the memory device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is embedded in the opening of the insulator 580 in this embodiment.

The insulator 574 is preferably provided in contact with the top surfaces of the insulator 580, the conductor 560, and the insulator 550. When the insulator 574 is formed by a sputtering method, the insulator 550 and the insulator 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

Furthermore, an insulator 581 functioning as an interlayer film is preferably provided over the insulator 574. As in the insulator 524 or the like, the concentration of impurities such as water and hydrogen in the insulator 581 is preferably lowered.

A conductor 540*a* and a conductor 540*b* are provided in the openings formed in the insulator 581, the insulator 574, the insulator 580, and the insulator 544. The conductor 540*a* and the conductor 540*b* are provided to face each other with the conductor 560 positioned therebetween. The conductor 540*a* and the conductor 540*b* have a structure similar to that of a conductor 546 and that of a conductor 548 described later.

An insulator 582 is provided over the insulator 581. A material having a barrier property against oxygen or hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

An insulator 586 is provided over the insulator 582. The insulator 586 can be formed using a material similar to that for the insulator 320. An interlayer film with a relatively low dielectric constant can reduce the parasitic capacitance between wirings. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be formed using a material similar to that for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 functions as a plug or a wiring that is connected to the transistor 500. The conductor 610 functions as an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 12; however, one embodiment of the present invention is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 positioned therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, copper (Cu), aluminum (Al), or the like, which is a low-resistance metal material, can be used.

An insulator 650 is provided over the conductor 620 and the insulator 630. The insulator 650 can be formed using a material similar to that used for the insulator 320. The insulator 650 may function as a planarization film that covers roughness due to underlying layers.

With use of the structure, a change in electrical characteristics can be prevented and reliability can be improved in a memory device including an OS transistor. An OS transistor with high on-state current can be provided. A transistor including an OS transistor with low off-state current can be provided. Furthermore, a memory device capable of holding data for a long time can be provided. Furthermore, miniaturization or high integration of a memory device including an OS transistor can be achieved.

<Structure Examples of Transistor>

The structure of the transistor 500 in this embodiment is not limited to the above. Examples of structures that can be used for the transistor 500 will be described below.

<Transistor Structure Example 1>

Figure 14A:
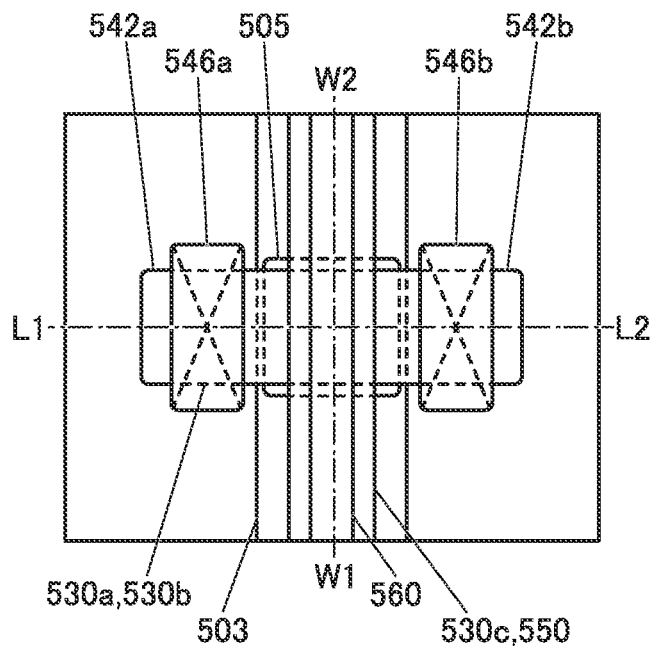
FIG. 14A is a top view illustrating a structure example of a transistor.
Figure 14C:
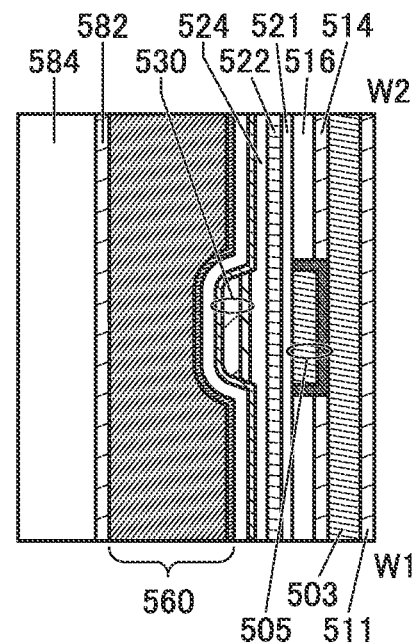
FIGS. 14B and 14C are cross-sectional views illustrating a structure example of the transistor.
Figure 14B:
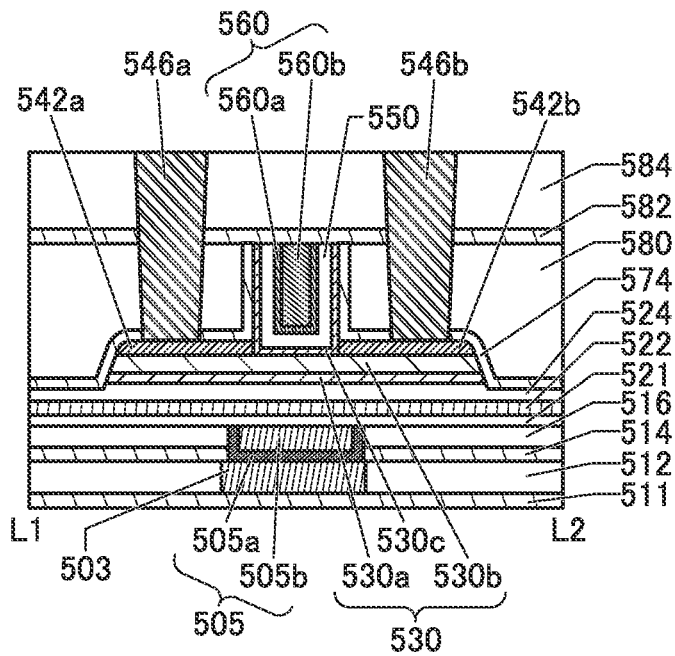

A structure example of a transistor 510A is described with reference to FIGS. 14A, 14B, and 14C. FIG. 14A is a top view of the transistor 510A. FIG. 14B is a cross-sectional view of a portion along the dashed-dotted line L1-L2 in FIG. 14A. FIG. 14C is a cross-sectional view of a portion along the dashed-dotted line W1-W2 in FIG. 14A. Note that for simplification of the drawing, some components are not illustrated in the top view in FIG. 14A.

FIGS. 14A, 14B, and 14C illustrate the transistor 510A and an insulator 511, an insulator 512, an insulator 514, an insulator 516, an insulator 580, an insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 14B, the oxide 530c, the insulator 550, and the conductor 560 are positioned in an opening provided in the insulator 580 with the insulator 574 positioned therebetween. Moreover, the oxide 530c, the insulator 550, and the conductor 560 are provided between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, silicon nitride, aluminum oxide, aluminum oxynitride, aluminum nitride, hafnium oxide, hafnium oxynitride, hafnium nitride oxide, hafnium nitride, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

For example, the insulator 511 preferably functions as a barrier film that inhibits entry of impurities such as water and hydrogen into the transistor 510A from the substrate side. Accordingly, the insulator 511 is preferably formed using an insulating material having a function of inhibiting diffusion of impurities such as a hydrogen atom, a hydrogen molecule, a water molecule, and a copper atom, that is, an insulating material through which the above impurities are less likely to pass. Alternatively, it is preferable to use an insulating material having a function of inhibiting diffusion of oxygen (e.g., at least one of oxygen atoms, oxygen molecules, and the like), that is, an insulating material through which the above oxygen is less likely to pass. Further alternatively, aluminum oxide or silicon nitride, for example, may be used for the insulator 511. With such a structure, impurities such as hydrogen or water can be prevented from diffusing into the transistor 510A from the substrate side through the insulator 511.

For example, the dielectric constant of the insulator 512 is preferably lower than that of the insulator 511. The use of a material having a low dielectric constant for the interlayer film can reduce the parasitic capacitance between wirings.

The conductor 503 is formed to be embedded in the insulator 512. Here, the top surface of the conductor 503 and the top surface of the insulator 512 can be at substantially the same level. Note that the conductor 503 having a single-layer structure is shown; however, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate electrode. The conductor 505 functions as a second gate electrode in some cases. In that case, by changing a potential applied to the conductor 505 independently of a potential applied to the conductor 560, the threshold voltage of the transistor 510A can be controlled. In particular, when a negative potential is supplied to the conductor 505, the threshold voltage of the transistor 510A can be higher than 0 V, and the off-state current can be reduced. Thus, a drain current when a potential applied to the conductor 560 is 0 V can be smaller in the case where a negative potential is applied to the conductor 505 than in the case where the negative potential is not applied to the conductor 505.

For example, when the conductor 505 and the conductor 560 overlap with each other, in the case where a potential is applied to the conductor 560 and the conductor 505, an electric field generated from the conductor 560 and an electric field generated from the conductor 505 are connected and can cover a channel formation region formed in the oxide 530.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel), like the transistor 500 described above.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. With this structure, impurities such as hydrogen or water can be prevented from diffusing into the transistor 510A side from the substrate side through the insulator 514. Moreover, for example, the insulator 516 preferably has a lower dielectric constant than the insulator 514. The use of a material having a low dielectric constant for the interlayer film can reduce the parasitic capacitance between wirings.

In the conductor 505 functioning as the second gate, the conductor 505*a* is formed in contact with an inner wall of an opening in the insulator 514 and the insulator 516, and the conductor 505*b* is formed further inside. Here, the top surfaces of the conductor 505*a* and the conductor 505*b* and the top surface of the insulator 516 can be substantially level with each other. Although the transistor 510A having a structure in which the conductor 505*a* and the conductor 505*b* are stacked is illustrated, the present invention is not limited thereto. For example, the conductor 505 may have a single-layer structure or a stacked-layer structure of three or more layers.

The conductor 505*a* is preferably formed using a conductive material having a function of inhibiting diffusion of impurities such as a hydrogen atom, a hydrogen molecule, a water molecule, and a copper atom, that is, a conductive material through which the above impurities are less likely to pass. Alternatively, the conductor 505*a* is preferably formed using a conductive material having a function of inhibiting diffusion of oxygen (e.g., at least one of oxygen atoms, oxygen molecules, and the like), that is, a conductive material through which the above oxygen is less likely to pass. Note that in this specification and the like, a function of inhibiting diffusion of impurities or oxygen means a function of inhibiting diffusion of any one or all of the above impurities and oxygen.

For example, when the conductor 505*a* has a function of inhibiting diffusion of oxygen, the conductivity of the conductor 505*b* can be prevented from being lowered because of oxidation.

In the case where the conductor 505 also functions as a wiring, the conductor 505*b* is preferably formed using a conductive material with high conductivity that contains tungsten, copper, or aluminum as its main component. In that case, the conductor 503 is not necessarily provided. Note that the conductor 505*b* is a single layer in the drawing but may have a stacked-layer structure, for example, a stacked-layer structure of titanium or titanium nitride and any of the above conductive materials.

The insulator 521, the insulator 522, and the insulator 524 function as a second gate insulating film.

The insulator 522 preferably has a barrier property. The insulator 522 having a barrier property functions as a layer that inhibits entry of impurities such as hydrogen into the transistor 510A from the surroundings of the transistor 510A.

The insulator 522 preferably has a single-layer structure or a stacked-layer structure using an insulator such as aluminum oxide, hafnium oxide, an oxide containing aluminum and hafnium (hafnium aluminate), oxynitride containing aluminum and hafnium, tantalum oxide, zirconium oxide, lead zirconate titanate (PZT), strontium titanate (SrTiO$_3$), or (Ba,Sr)TiO$_3$ (BST), for example. With miniaturization and high integration of a transistor, a problem such as generation of leakage current sometimes arises because of a thin gate insulating film. When a high-k material is used for an insulator functioning as the gate insulating film, a gate potential at the time of operating the transistor can be reduced while the physical thickness of the gate insulating film is kept.

It is preferable that the insulator 521 be thermally stable. For example, silicon oxide and silicon oxynitride are preferred because of their thermal stability. Furthermore, combination of an insulator which is a high-k material and silicon oxide or silicon oxynitride enables the insulator 521 to have a stacked-layer structure that is thermally stable and has a high dielectric constant.

Although the second gate insulating film in FIGS. 14B and 14C have a stacked structure of three layers, it may have a structure including two or less layers or a sacked structure including four or more layers. In that case, the stacked layers are not necessarily formed of the same material and may be formed of different materials.

The oxide 530 including a region functioning as the channel formation region includes the oxide 530*a*, the oxide 530*b* over the oxide 530*a*, and the oxide 530*c* over the oxide 530*b*. Including the oxide 530*a* under the oxide 530*b* makes it possible to inhibit diffusion of impurities into the oxide 530*b* from the components formed below the oxide 530*a*. By including the oxide 530*c* over the oxide 530*b*, the oxide 530 can prevent impurities from diffusing into the oxide 530*b* from the components formed above the oxide 530*c*. As the oxide 530, the oxide semiconductor which is one kind of the above described metal oxides can be used.

Note that the oxide 530*c* is preferably provided in the opening provided in the insulator 580 with the insulator 574 positioned therebetween. When the insulator 574 has a barrier property, diffusion of impurities from the insulator 580 into the oxide 530 can be prevented.

One of the conductor 542 (542*a* and 542*b*) functions as a source electrode and the other functions as a drain electrode.

For the conductor 542*a* and the conductor 542*b*, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is illustrated in FIG. 14B, a stacked-layer structure of two or more layers may be used. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 542. For the barrier layer, a material having a barrier property against oxygen or hydrogen is preferably used. This structure can inhibit oxidation of the conductor 542 at the time of depositing the insulator 574.

For the barrier layer, for example, a metal oxide can be used. In particular, an insulating film having a barrier property against oxygen or hydrogen, such as an aluminum oxide film, a hafnium oxide film, or a gallium oxide film, is preferably used. Alternatively, silicon nitride deposited by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening in the insulator 580 with the oxide 530c and the insulator 574 positioned between the insulator 580 and the insulator 550.

With miniaturization and high integration of a transistor, a problem such as generation of leakage current sometimes arises because of a thin gate insulating film. In that case, the insulator 550 may have a stacked-layer structure like the second gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, a conductive material having a function of inhibiting diffusion of oxygen (e.g., at least one of oxygen atoms and oxygen molecules) is preferably used.

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity of the conductor 560b.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is formed by a sputtering method, the conductor 560a can have a reduced electric resistance and become a conductor. Such a conductor can be referred to as an oxide conductor (OC) electrode.

For the conductor 560b, it is preferable to use a conductive material containing tungsten, copper, or aluminum as its main component. The conductor 560b also functions as a wiring and thus the conductor 560b is preferably a conductor having high conductivity. For example, a conductive material containing tungsten, copper, or aluminum as its main component can be used. The conductor 560b may have a stacked-layer structure, for example, a stacked-layer structure of titanium, titanium nitride, and any of the above conductive materials.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 574 can inhibit diffusion of impurities such as water and hydrogen contained in the insulator 580 into the oxide 530b through the oxide 530c and the insulator 550. Moreover, the oxidation of the conductor 560 due to excess oxygen in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water and hydrogen into the transistor 510A from the outside.

Like the insulator 516, the insulator 580 and the insulator 584 preferably have a lower dielectric constant than the insulator 582. The use of a material having a low dielectric constant for the interlayer film can reduce the parasitic capacitance between wirings.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers, as in the conductor 505. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, an OS transistor having a high on-state current can be provided. A transistor including an OS transistor with low off-state current can be provided. In addition, a change in electrical characteristics can be prevented and reliability can be improved in a memory device including an OS transistor.

<Transistor Structure Example 2>

Figure 15A:
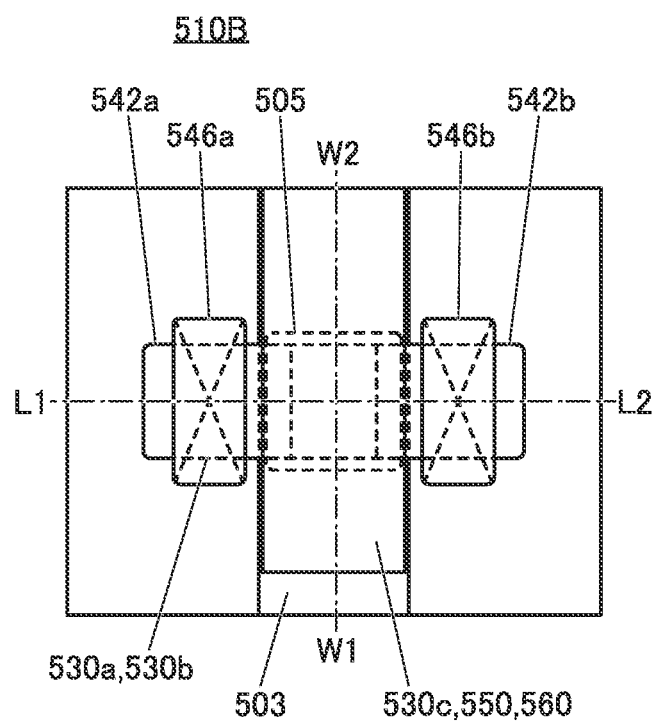
FIG. 15A is a top view illustrating a structure example of a transistor.
Figure 15C:
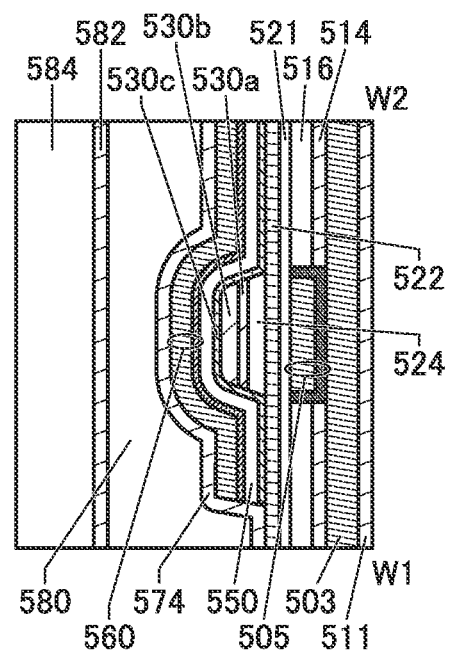
FIGS. 15B and 15C are cross-sectional views illustrating a structure example of the transistor.
Figure 15B:
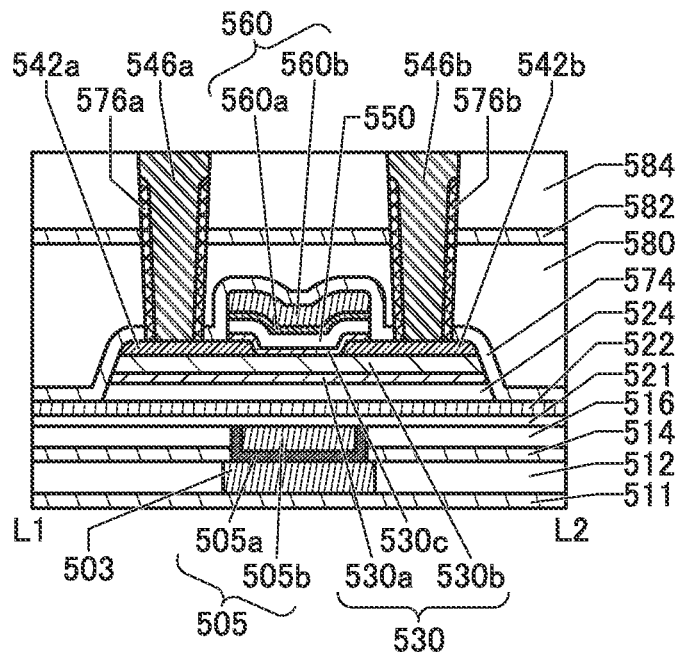

A structure example of a transistor 510B is described with reference to FIGS. 15A, 15B, and 15C. FIG. 15A is a top view of the transistor 510B. FIG. 15B is a cross-sectional view of a portion along the dashed-dotted line L1-L2 in FIG. 15A. FIG. 15C is a cross-sectional view of a portion along the dashed-dotted line W1-W2 in FIG. 15A. Note that for simplification of the drawing, some components in the top view in FIG. 15A are not illustrated.

The transistor 510B is a modification example of the transistor 510A. Therefore, the point different from the transistor 510A will be mainly described to avoid repeated description.

The transistor 510B includes a region where the conductor 542 (the conductor 542a and the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, a conductive material having a function of inhibiting diffusion of oxygen (e.g., at least one of oxygen atoms and oxygen molecules) is preferably used.

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity of the conductor 560b.

The insulator 574 is preferably provided to cover the top surface and the side surface of the conductor 560, the side surface of the insulator 550, and the side surface of the oxide 530c. Note that the insulator 574 is preferably formed using an insulating material having a function of inhibiting diffusion of oxygen and impurities such as water or hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 574 can inhibit the oxidation of the conductor 560. In addition, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a memory device with low power consumption. Specifically, it is possible to use a material with a low oxidation resistance and high conductivity, such as tungsten or aluminum. Moreover, for example, a conductor that can be easily deposited or processed can be used.

<Transistor Structure Example 3>

Figure 16A:
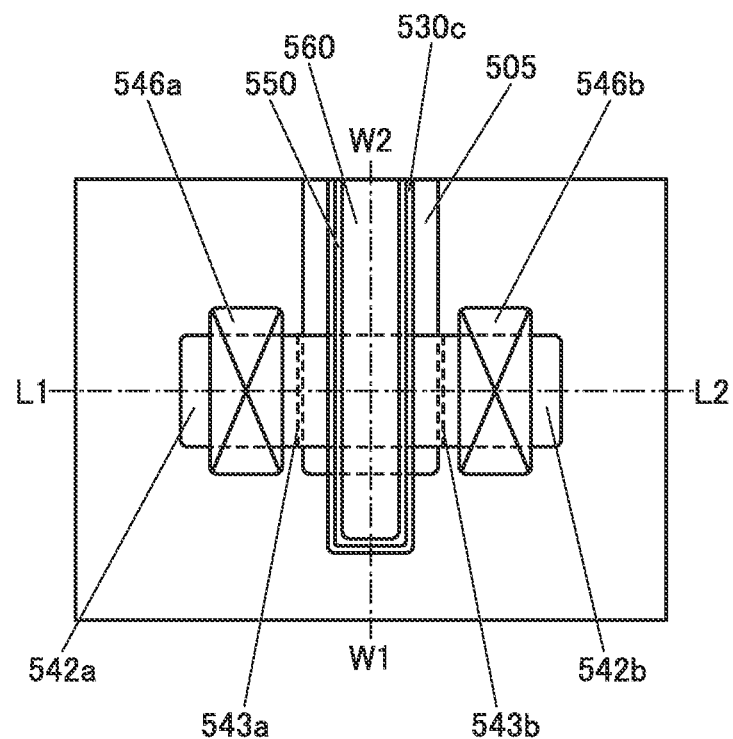
FIG. 16A is a top view illustrating a structure example of a transistor.
Figure 16C:
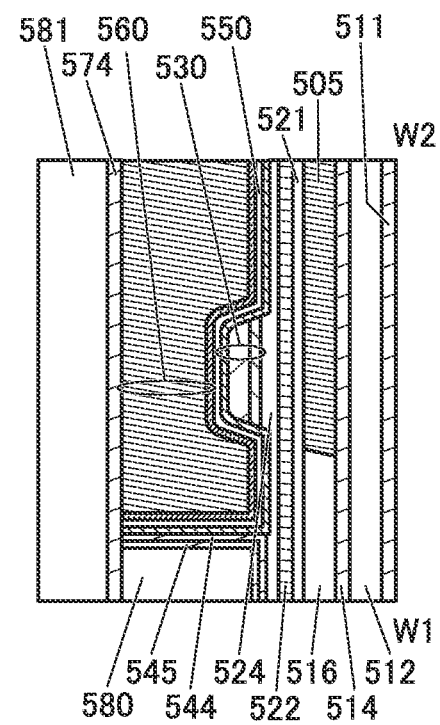
FIGS. 16B and 16C are cross-sectional views illustrating a structure example of the transistor.
Figure 16B:
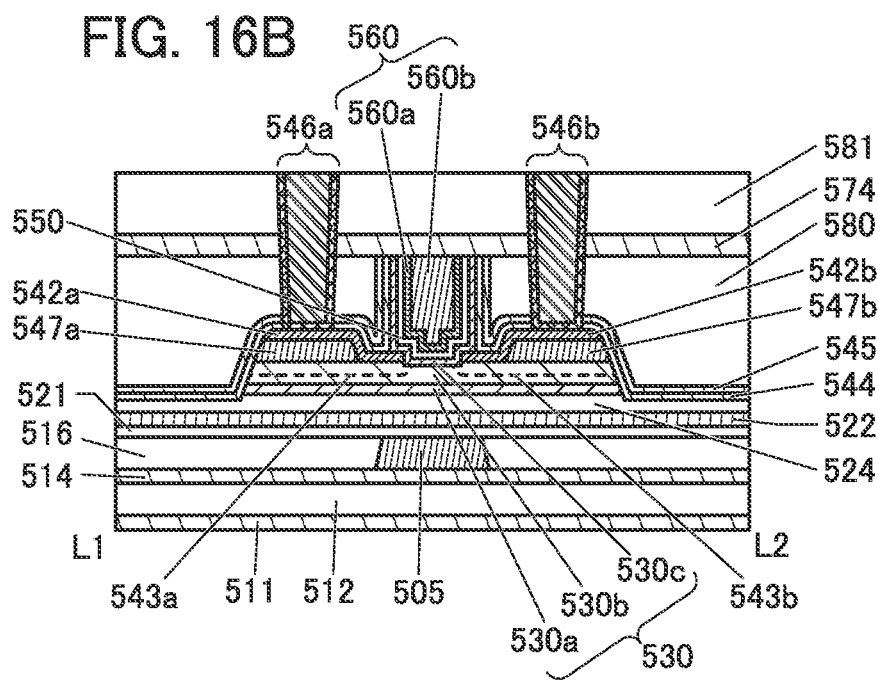

A structure example of a transistor 510C is described with reference to FIGS. 16A, 16B, and 16C. FIG. 16A is a top view of the transistor 510C. FIG. 16B is a cross-sectional view of a portion along the dashed-dotted line L1-L2 in FIG. 16A. FIG. 16C is a cross-sectional view of a portion along the dashed-dotted line W1-W2 in FIG. 16A. Note that for simplification of the drawing, some components are not illustrated in the top view in FIG. 16A.

The transistor 510C is a variation example of the transistor 510A. Therefore, the point different from the transistor 510A will be mainly described to avoid repeated description.

The transistor 510C illustrated in FIGS. 16A, 16B, and 16C includes a conductor 547a between the conductor 542a and the oxide 530b, and a conductor 547b between the conductor 542b and the oxide 530b. The conductor 542a (the conductor 542b) has a region that extends beyond the top surface of the conductor 547a (the conductor 547b) and its side surface close to the conductor 560 and is in contact with the top surface of the oxide 530b. Here, for the conductor 547, a conductor that can be used for the conductor 542 is used. It is preferred that the thickness of the conductor 547 be at least greater than that of the conductor 542.

In the transistor 510C in FIGS. 16A, 16B, and 16C having such a structure, the conductor 542 can be closer to the conductor 560 than that in the transistor 510A is. Alternatively, the conductor 560 and the end portions of the conductors 542a and 542b can overlap each other. Accordingly, an effective channel length of the transistor 510C can be shortened; thus, the transistor 510C can have a high on-state current and improved frequency characteristics.

The conductor 547a (the conductor 547b) is preferably provided to overlap with the conductor 542a (the conductor 542b). With this structure, the conductor 547a (the conductor 547b) can function as a stopper to prevent over-etching of the oxide 530b in etching for forming the opening in which the conductor 546a (the conductor 546b) is to be embedded.

In the transistor 510C in FIGS. 16A, 16B, and 16C, the insulator 545 is provided on and in contact with the insulator 544. The insulator 544 preferably functions as a barrier insulating film for inhibiting excess oxygen or impurities such as water or hydrogen from entering the transistor 510C from the insulator 580 side. The insulator 545 can be formed using an insulator that can be used as the insulator 544. The insulator 544 may be formed using a nitride insulator such as aluminum nitride, aluminum titanium nitride, titanium nitride, silicon nitride, or silicon nitride oxide, for example.

Unlike in the transistor 510A illustrated in FIGS. 14A, 14B, and 14C, in the transistor 510C illustrated in FIGS. 16A, 16B, and 16C, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Here, the top surface of the conductor 505 preferably has favorable planarity. For example, the average surface roughness (Ra) of the top surface of the conductor 505 is less than or equal to 1 nm, preferably less than or equal to 0.5 nm, further preferably less than or equal to 0.3 nm. This allows the improvement in planarity of the insulating layer formed over the conductor 505 and the increase in crystallinity of the oxide 530b and the oxide 530c.

<Transistor Structure Example 4>

Figure 17A:
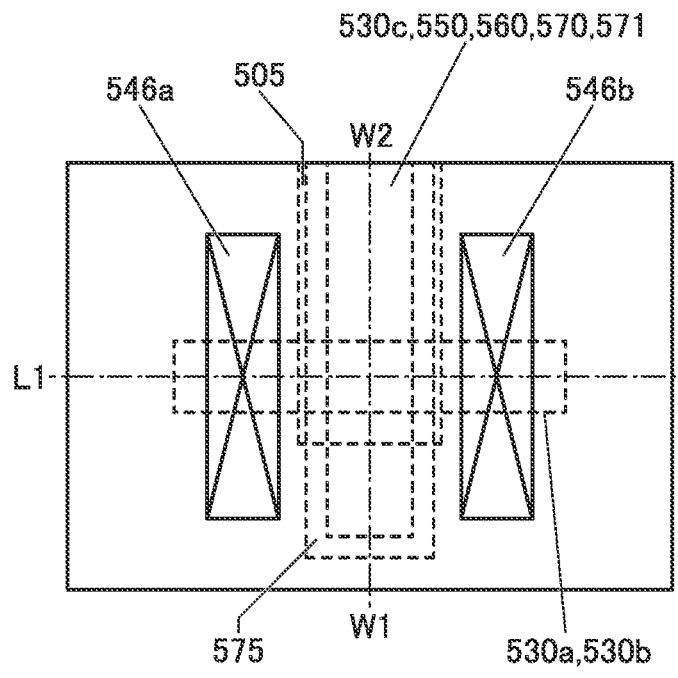
FIG. 17A is a top view illustrating a structure example of a transistor.
Figure 17C:
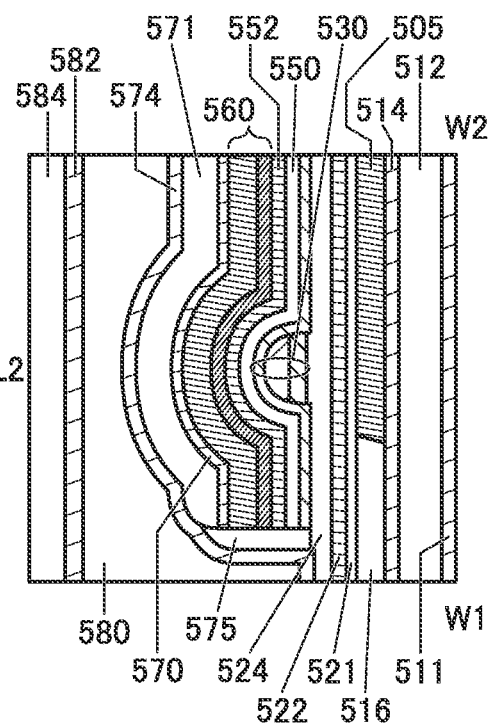
FIGS. 17B and 17C are cross-sectional views illustrating a structure example of the transistor.
Figure 17B:
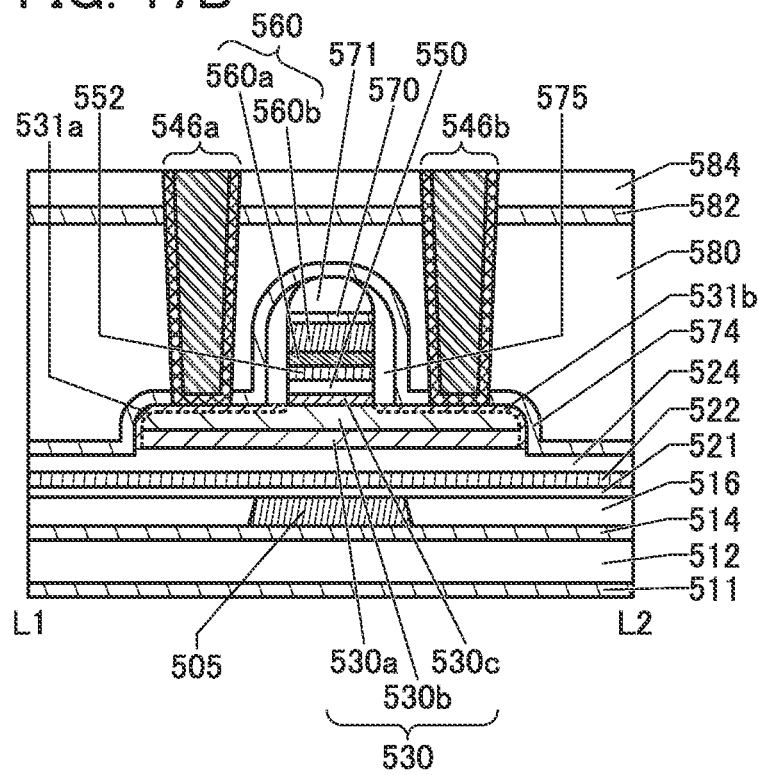

A structure example of a transistor 510D is described with reference to FIGS. 17A, 17B, and 17C. FIG. 17A is a top view of the transistor 510D. FIG. 17B is a cross-sectional view of a portion along the dashed-dotted line L1-L2 in FIG. 17A. FIG. 17C is a cross-sectional view of a portion along the dashed-dotted line W1-W2 in FIG. 17A. Note that for simplification of the drawing, some components in the top view in FIG. 17A are not illustrated.

The transistor 510D is a modification example of the above transistor. Therefore, differences from the above transistors are mainly described to avoid repeated description.

In FIGS. 17A, 17B, and 17C, the conductor 503 is not provided and the conductor 505 functioning as the second gate also functions as a wiring. In addition, the insulator 550 is provided over the oxide 530c, and a metal oxide 552 is provided over the insulator 550. The conductor 560 is placed over the metal oxide 552, and an insulator 570 is placed over the conductor 560. An insulator 571 is placed over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of the first gate. For example, an oxide semiconductor that can be used as the oxide 530 can be used as the metal oxide 552. In that case, when the conductor 560 is formed by a sputtering method, the metal oxide 552 can have a reduced electric resistance and become a conductive layer. Such a conductor can be referred to as an oxide conductor (OC) electrode.

The metal oxide 552 functions as the part of a gate insulating film in some cases. For that reason, when silicon oxide, silicon oxynitride, or the like is used for the insulator 550, the metal oxide 552 is preferably a metal oxide that is a high-k material with a high dielectric constant. Such a stacked-layer structure can be thermally stable and can have a high dielectric constant. Accordingly, a gate potential that is applied during operation of the transistor can be lowered while the physical thickness of the gate insulator is maintained. In addition, the equivalent oxide thickness (EOT) of an insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of a gate insulating film may be stacked.

With the metal oxide 552 functioning as a gate electrode, the on-state current of the transistor 510D can be increased without a reduction in influence of electric fields from the conductor 560. Meanwhile, with the metal oxide 552 functioning as a gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric fields applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized by heat treatment in a later step. Therefore, it is preferable to use hafnium aluminate. Note that the metal oxide 552 is not necessarily provided. Design is determined as appropriate in consideration of required transistor characteristics.

For the insulator 570, an insulating material having a function of inhibiting the passage of oxygen and impurities such as water or hydrogen is preferably used. For example, aluminum oxide or hafnium oxide is preferably used. Thus, oxidization of the conductor 560 due to oxygen from above the insulator 570 can be inhibited. Moreover, impurities such as water or hydrogen from above the insulator 570 can be prevented from entering the oxide 530 through the conductor 560 and the insulator 550.

The insulator 571 functions as a hard mask. By provision of the insulator 571, the conductor 560 can be processed to have a side surface that is substantially perpendicular. Specifically, the angle formed by the side surface of the conductor 560 and the substrate surface can be greater than or equal to 75° and less than or equal to 100°, preferably greater than or equal to 80° and less than or equal to 95°.

An insulating material having a function of inhibiting the passage of oxygen and impurities such as water or hydrogen may be used for the insulator 571 so that the insulator 571 also functions as a barrier layer. In this case, the insulator 570 is not necessarily provided.

The insulator 570, the conductor 560, the metal oxide 552, the insulator 550, and the oxide 530c are selectively removed using the insulator 571 as a hard mask, whereby their side surfaces can be substantially aligned with each other and the surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531*b*, so that the parasitic capacitance can be reduced. Moreover, an offset region is not formed between a channel formation region and the source/drain region (the region 531*a* or the region 531*b*). The formation of the region 531*a* and the region 531*b* in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of an insulator 575. In this case, the insulator 575 serves as a mask like the insulator 571 or the like. Thus, the impurity element is not added to the region of the oxide 530*b* overlapping with the insulator 575, so that the electrical resistivity of the region can be kept high.

The transistor 510D includes the insulator 575 on the side surfaces of the insulator 570, the conductor 560, the metal oxide 552, the insulator 550, and the oxide 530*c*. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used as the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably formed by a sputtering method. The insulator formed by a sputtering method can be an insulator containing few impurities such as water or hydrogen. For example, aluminum oxide is preferably used for the insulator 574.

Note that an oxide film formed by a sputtering method may extract hydrogen from the component over which the oxide film is formed. Thus, the hydrogen concentration in the oxide 530 and the insulator 575 can be reduced when the insulator 574 absorbs hydrogen and water from the oxide 530 and the insulator 575.

<Transistor Structure Example 5>

A structure example of a transistor 510E is described with reference to FIGS. 18A, 18B, and 18C. FIG. 18A is a top view of the transistor 510E. FIG. 18B is a cross-sectional view of a portion along the dashed-dotted line L1-L2 in FIG. 18A. FIG. 18C is a cross-sectional view of a portion along the dashed-dotted line W1-W2 in FIG. 18A. Note that for simplification of the drawing, some components in the top view in FIG. 18A are not illustrated.

The transistor 510E is a modification example of the above transistor. Therefore, differences from the above transistors are mainly described to avoid repeated description.

In FIGS. 18A, 18B, and 18C, the conductor 542 is not provided, and part of the exposed surface of the oxide 530*b* includes the region 531*a* and the region 531*b*. One of the region 531*a* and the region 531*b* functions as a source region, and the other functions as a drain region. Moreover, an insulator 573 is provided between the oxide 530*b* and the insulator 574.

A region 531 (a region 531*a* and a region 531*b*) illustrated in FIG. 18B is a region where the above element is added to the oxide 530*b*. The region 531 can be formed with the use of a dummy gate, for example.

Specifically, a dummy gate is provided over the oxide 530*b*, and an element that reduces the resistance of the oxide 530*b* is added using the dummy gate as a mask. That is, the element is added to regions of the oxide 530, which do not overlap with the dummy gate, whereby the region 531 is formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of a rare gas include helium, neon, argon, krypton, and xenon. The concentration of the element may be measured by SIMS or the like.

Boron and phosphorus are particularly preferable because an apparatus in a manufacturing line for low-temperature polysilicon transistors, for example, can be used. Since the existing facility can be used, capital investment can be reduced.

Next, an insulating film to be the insulator 573 and an insulating film to be the insulator 574 may be deposited over the oxide 530*b* and the dummy gate. Stacking an insulating film to be the insulator 573 and an insulating film to be the insulator 574 can provide a region where the region 531, the oxide 530*c*, and the insulator 550 overlap with each other.

Specifically, after an insulating film to be the insulator 580 is provided over the insulating film to be the insulator 574, the insulating film to be the insulator 580 is subjected to chemical mechanical polishing (CMP) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at the side surface of the opening provided in the insulator 580, and the region 531 provided in the oxide 530*b* is partly exposed at the bottom surface of the opening. Next, an oxide film to be the oxide 530*c*, an insulating film to be the insulator 550, and a conductive film to be the conductor 560 are formed in this order in the opening, and then are partly removed by CMP treatment or the like until the insulator 580 is exposed. Consequently, the transistor illustrated in FIGS. 18A, 18B, and 18C can be formed.

Note that the insulator 573 and the insulator 574 are not essential components. Design is determined as appropriate in consideration of required transistor characteristics.

An existing apparatus can be used and the conductor 542 is not provided for manufacturing the transistor illustrated in FIGS. 18A, 18B, and 18C, resulting in reduction in cost.

<Transistor Structure Example 6>

Figure 19A:
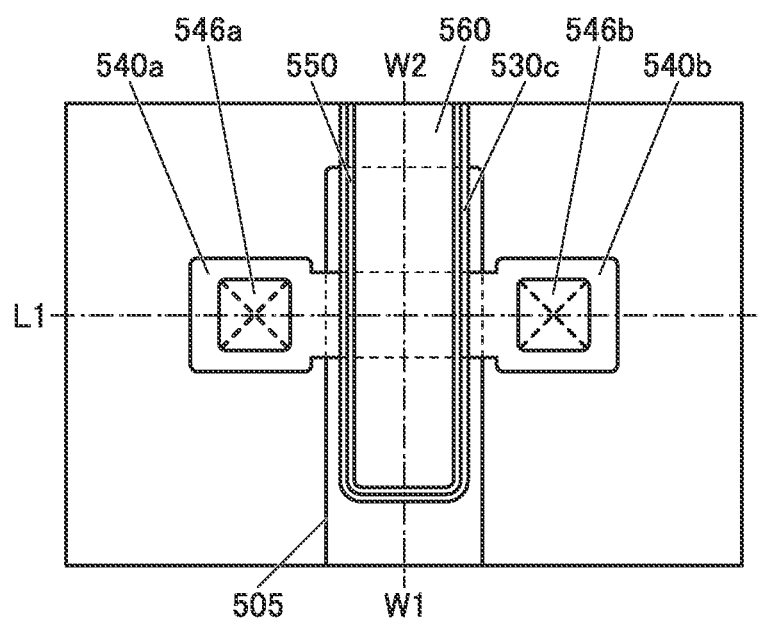
FIG. 19A is a top view illustrating a structure example of a transistor.
Figure 19C:
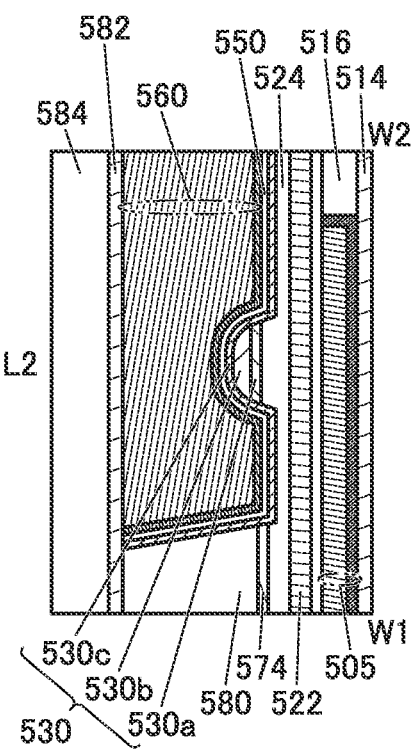
FIGS. 19B and 19C are cross-sectional views illustrating a structure example of the transistor.
Figure 19B:
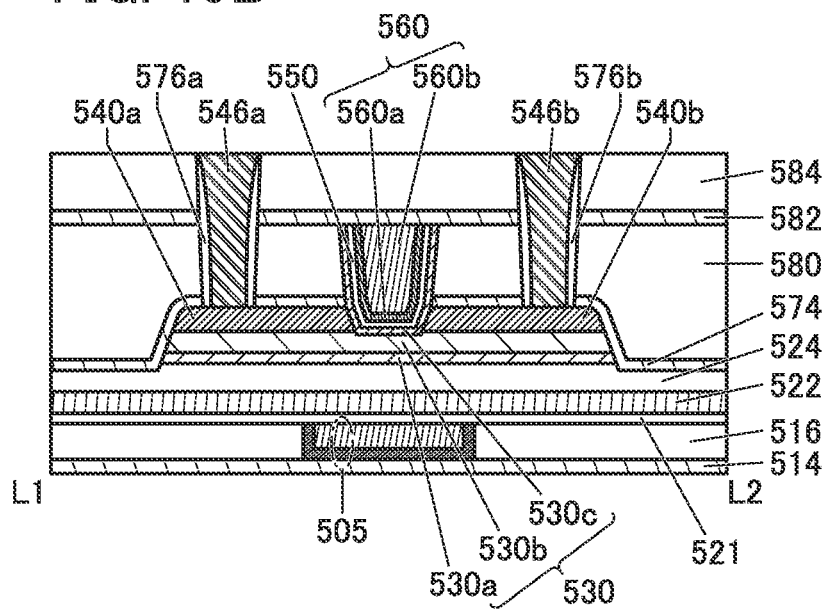

A structure example of a transistor 510F is described with reference to FIGS. 19A, 19B, and 19C. FIG. 19A is a top view of the transistor 510F. FIG. 19B is a cross-sectional view of a portion along the dashed-dotted line L1-L2 in FIG. 19A. FIG. 19C is a cross-sectional view of a portion along the dashed-dotted line W1-W2 in FIG. 19A. Note that for simplification of the drawing, some components are not illustrated in the top view in FIG. 19A.

The transistor 510F is a modification example of the above transistor 510A. Therefore, differences from the above transistors are mainly described to avoid repeated description.

In the transistor 510A, part of the insulator 574 is provided in the opening provided in the insulator 580 and covers a side surface of the conductor 560. Meanwhile, in the transistor 510F, an opening is formed by partly removing the insulator 580 and the insulator 574.

The insulator 576 (the insulator 576a and the insulator 576b) having a barrier property may be provided between the conductor 546 and the insulator 580. Providing the insulator 576 can prevent oxygen in the insulator 580 from reacting with the conductor 546 and oxidizing the conductor 546.

The oxide 530 preferably has a stacked-layer structure of oxide layers which differ in the atomic ratio of metal atoms when an oxide semiconductor is used as the oxide 530. Specifically, the atomic ratio of the element M to constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Moreover, the atomic ratio of In to the element M in the metal oxide used as the oxide 530b is preferably greater than that in the metal oxide used as the oxide 530a. The oxide 530c can be formed using a metal oxide that can be used as the oxide 530a or 530b.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. Accordingly, extraction of oxygen from the oxide 530b by the source electrode or the drain electrode can be suppressed. This inhibits extraction of oxygen from the oxide 530b even when heat treatment is performed; hence, the transistor 510F is stable against high temperatures in the manufacturing process (i.e., thermal budget).

Note that one or both of the oxide 530a and the oxide 530c may be omitted. The oxide 530 may be a single layer of the oxide 530b. In the case where the oxide 530 has a stacked structure of the oxide 530a, the oxide 530b, and the oxide 530c, the conduction band minimum of each of the oxides 530a and 530c is preferably higher than that of the oxide 530b. In other words, the electron affinity of each of the oxide 530a and the oxide 530c is preferably smaller than that of the oxide 530b. In that case, the oxide 530c is preferably formed using a metal oxide that can be used as the oxide 530a. Specifically, the atomic ratio of the element M to constituent elements in the metal oxide used as the oxide 530c is preferably greater than that in the metal oxide used as the oxide 530b. Moreover, the atomic ratio of the element M to In in the metal oxide used as the oxide 530c is preferably greater than that in the metal oxide used as the oxide 530b. Moreover, the atomic ratio of In to the element M in the metal oxide used as the oxide 530b is preferably greater than that in the metal oxide used as the oxide 530c.

Here, the energy level of the conduction band minimum is gradually varied at a junction portion of each of the oxides 530a, 530b, and 530c. In other words, the energy level of the conduction band minimum at a junction portion of each of the oxides 530a, 530b, and 530c is continuously varied or continuously connected. To vary the energy level gradually, the density of defect states in a mixed layer formed at the interface between the oxides 530a and 530b and the interface between the oxides 530b and 530c is preferably made low.

Specifically, when the oxides 530a and 530b or the oxides 530b and 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as each of the oxides 530a and 530c. The oxide 530c may have a stacked-layer structure. For example, a stacked-layer structure of an In—Ga—Zn oxide and a Ga—Zn oxide over the In—Ga—Zn oxide, or a stacked-layer structure of an In—Ga—Zn oxide and a gallium oxide over the In—Ga—Zn oxide can be used. In other words, the metal oxide 530c may have a stacked-layer structure of an In—Ga—Zn oxide and an oxide that does not contain In.

Specifically, as the oxide 530a, a metal oxide having an atomic ratio of In:Ga:Zn=1:3:4 or In:Ga:Zn=1:1:0.5 is used. As the oxide 530b, a metal oxide having an atomic ratio of In:Ga:Zn=4:2:3 or In:Ga:Zn=3:1:2 can be used. As the oxide 530c, a metal oxide having an atomic ratio of In:Ga:Zn=1:3:4, In:Ga:Zn=4:2:3, Ga:Zn=2:1, or Ga:Zn=2:5 can be used. Furthermore, as a specific example of the oxide 530c having a stacked-layer structure, a stacked-layer structure of a layer having an atomic ratio of In:Ga:Zn=4:2:3 and a layer having an atomic ratio of Ga:Zn=2:1, a stacked-layer structure of a layer having an atomic ratio of In:Ga:Zn=4:2:3 and a layer having an atomic ratio of Ga:Zn=2:5, or a stacked-layer structure of a layer having an atomic ratio of In:Ga:Zn=4:2:3 and a gallium oxide can be given.

At this time, the oxide 530b serves as a main carrier path. When the oxides 530a and 530c have the above structure, the density of defect states at the interface between the oxides 530a and 530b and the interface between the oxides 530b and 530c can be made low. This reduces the influence of interface scattering on carrier conduction, and the transistor 510F can have a high on-state current and high frequency characteristics. Note that in the case where the oxide 530c has a stacked-layer structure, not only the density of defect state at the interface between the oxides 530b and 530c would be made low, but also the constituent element of the oxide 530c would be inhibited from being diffused into the insulator 550 side. More specifically, since the oxide 530c has a stacked-layer structure in which the oxide in the upper layer does not contain In, In can be inhibited from being diffused into the insulator 550 side. Since the insulator 550 functions as a gate insulator, the transistor would show poor characteristics when In diffuses into the insulator 550. Thus, the metal oxide 530c having a stacked-layer structure allows the memory device to have high reliability.

The oxide 530 is preferably formed using a metal oxide functioning as an oxide semiconductor. For example, the metal oxide to be the channel formation region of the oxide 530 has a band gap greater than or equal to 2 eV, preferably greater than or equal to 2.5 eV. The use of such a metal oxide having a wide band gap can reduce the off-state current of the transistor. The use of such a transistor can provide a memory device with low power consumption.

<Transistor Structure Example 7>

A structure example of a transistor 510G is described with reference to FIGS. 20A and 20B. The transistor 510G is a modification example of the transistor 500. Therefore, differences from the above transistors are mainly described to avoid repeated description. Note that the structure illustrated in FIGS. 20A and 20B can be employed for other transistors included in the memory device, such as the transistor 300, according to one embodiment of the present invention.

Figure 20A:
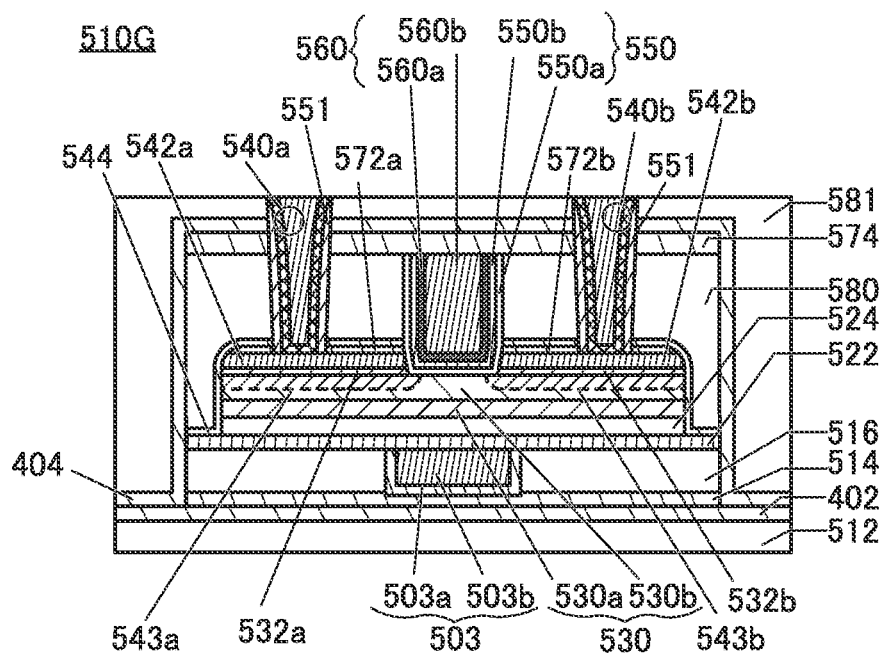
FIGS. 20A and 20B are cross-sectional views illustrating a structure example of a transistor.
Figure 20B:
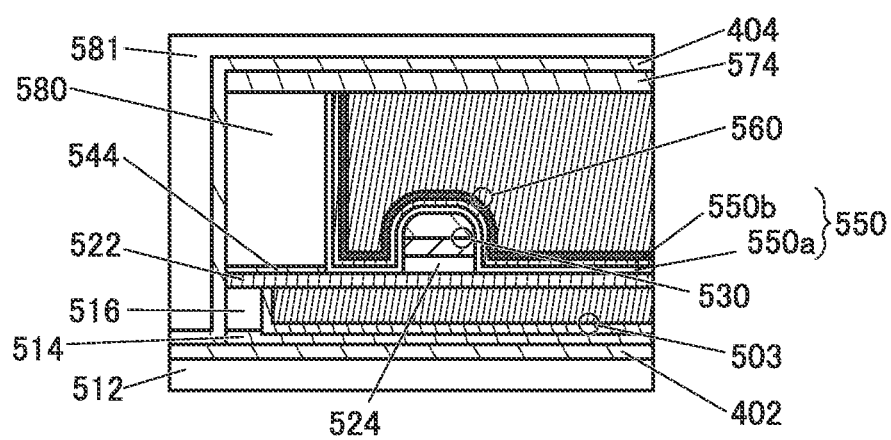

FIG. 20A is a cross-sectional view in the channel length direction of a transistor 510G and FIG. 20B is a cross-sectional view in the channel width direction of the transistor 510G. The transistor 510G illustrated in FIGS. 20A and 20B is different from the transistor 500 illustrated in FIGS. 13A and 13B in that the insulator 402 and the insulator 404 are provided and that the insulator 550 includes an insulator 550a and an insulator 550b. In addition, differences from the transistor 500 illustrated in FIGS. 13A and 13B are that an insulator 551 is provided in contact with side surfaces of the conductor 540a and the conductor 540b, that a conductor 572a is provided in contact with a top surface of the conductor 542a, that a conductor 532a is provided in contact with a top surface of the region 543a, that a conductor 572b is provided in contact with a top surface of the conductor 542b, and that a conductor 532b is provided in contact with a top surface of the region 543b. Furthermore, neither the insulator 520 nor the oxide 530c is not included, which is a different point from the transistor 500 illustrated in FIGS. 13A and 13B.

In the transistor 510G illustrated in FIGS. 20A and 20B, the insulator 402 is provided over the insulator 512. The insulator 404 is provided over the insulator 574 and the insulator 402.

In the structure of the transistor 510G illustrated in FIGS. 20A and 20B, the insulator 514, the insulator 516, the insulator 522, the insulator 544, the insulator 544, the insulator 580, and the insulator 574 are patterned and covered with the insulator 404. That is, the insulator 404 is in contact with the top surfaces of the insulator 574 and the insulator 402 and the side surfaces of the insulator 574, the insulator 580, the insulator 544, the insulator 522, the insulator 516, and the insulator 514. With such a structure, the oxide 530 and the like are isolated from the outside by the insulator 404 and the insulator 402.

The insulator 402 and the insulator 404 preferably have high capability of inhibiting diffusion of hydrogen (e.g., at least one of hydrogen atoms, hydrogen molecules, and the like) or water molecules. For example, the insulator 402 and the insulator 404 are preferably formed using silicon nitride or silicon nitride oxide with a high hydrogen barrier property. This can inhibit diffusion of hydrogen or the like into the oxide 530, thereby suppressing the degradation of the characteristics of the transistor 510G. Therefore, a memory device including the OS transistor can have high reliability.

For the insulator 550a, silicon oxide, silicon oxynitride, or the like can be used, and the insulator 550b can be formed using hafnium oxide or the like. In that case, oxidation of the conductor 560 can be inhibited. For the conductor 572a and the conductor 572b, aluminum oxide, hafnium oxide, an oxide containing aluminum and hafnium (hafnium aluminate), or the like can be used. For the conductor 532a and the conductor 532b, a metal oxide used for the oxide 530a can be used for example. In that case, oxidation of the conductor 542a and the conductor 542b can be inhibited.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, as the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Accordingly, the reliability of the memory device including the OS transistor can be increased.

Figure 21:
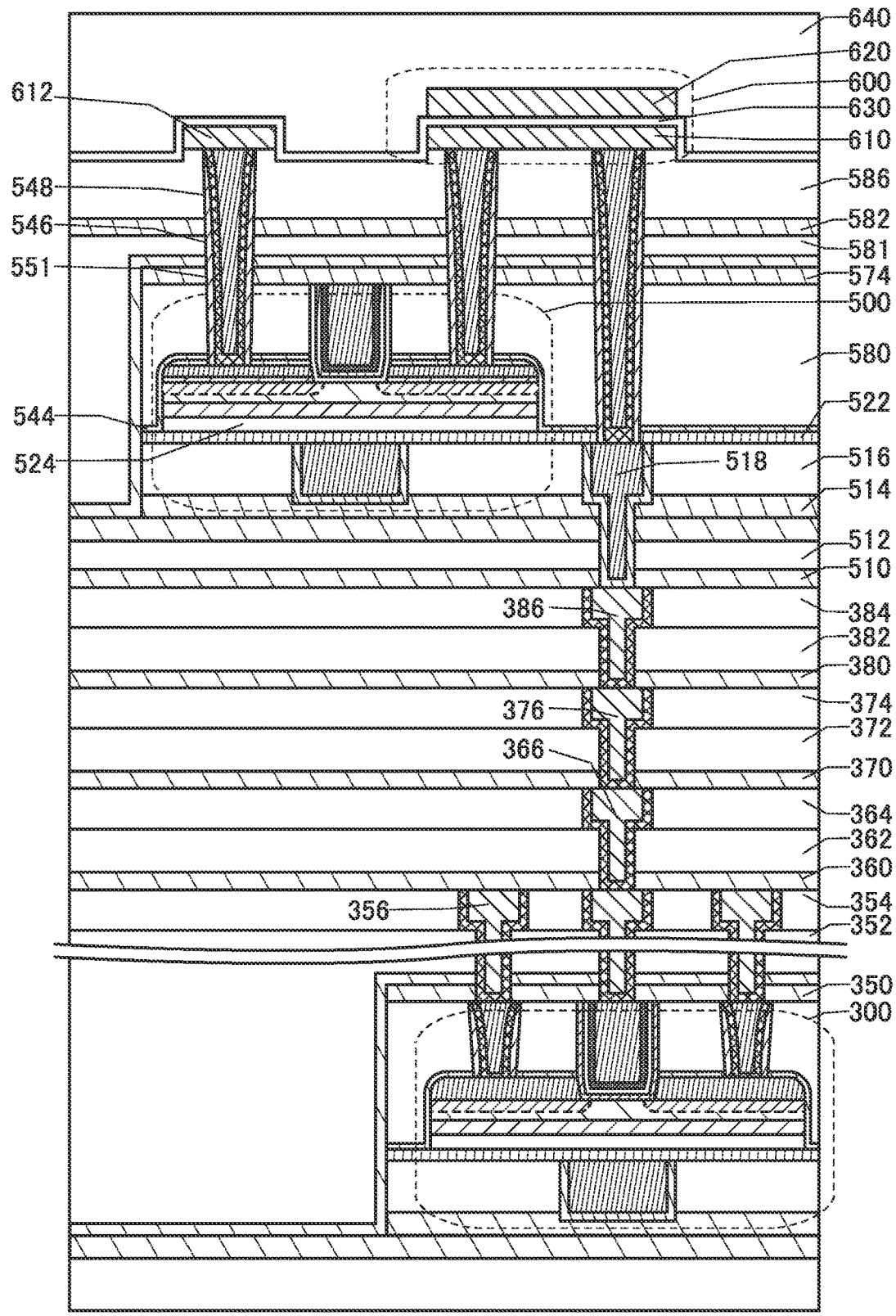
FIG. 21 is a cross-sectional view of a structure example of a memory device.

FIG. 21 is a cross-sectional view illustrating a structure example of the memory device in the case where the transistors 500 and 300 have the structure illustrated in FIGS. 20A and 20B. The insulator 551 is provided on the side surface of the conductor 546.

<Transistor Structure Example 8>

A structure example of a transistor 510H is described with reference to FIGS. 22A and 22B. The transistor 510H is a modification example of the transistor 500. Therefore, differences from the above transistors are mainly described to avoid repeated description. Note that the structure illustrated in FIGS. 22A and 22B can be employed for other transistors included in the memory device, such as the transistor 300, according to one embodiment of the present invention.

Figure 22A:
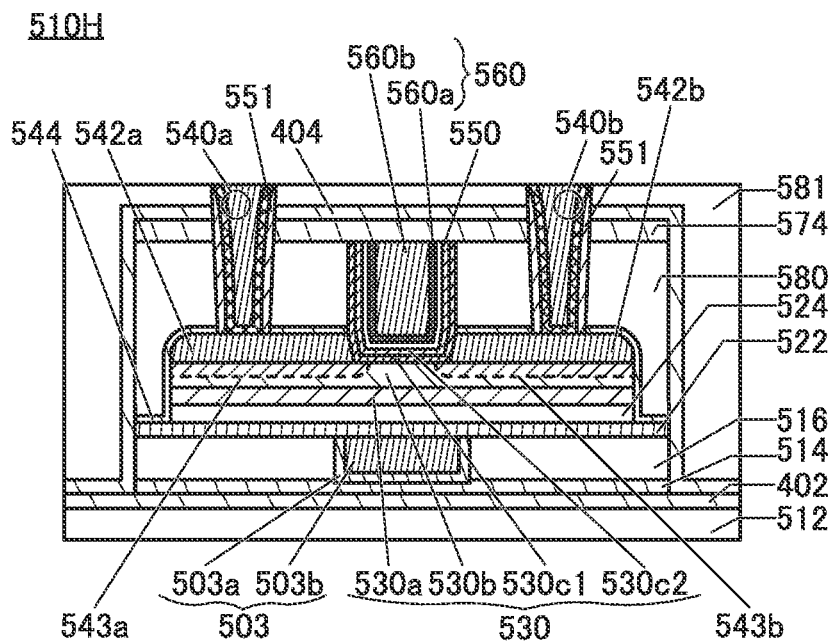
FIGS. 22A and 22B are cross-sectional views illustrating a structure example of a transistor.
Figure 22B:
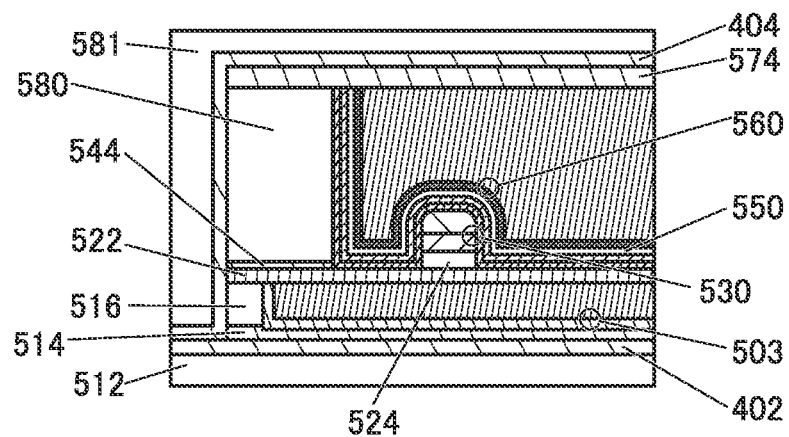

FIGS. 22A and 22B illustrate a modification example of the transistor illustrated in FIGS. 13A and 13B. FIG. 22A is a cross-sectional view of the transistor in the channel length direction, and FIG. 22B is a cross-sectional view of the transistor in the channel width direction. The transistor illustrated in FIGS. 22A and 22B is different from the transistor 500 in FIGS. 13A and 13B in that the insulator 402 and the insulator 404 are included. In addition, a difference from the transistor 500 in FIGS. 13A and 13B is that the insulator 551 is provided in contact with the side surfaces of the conductor 540a and the conductor 540b. Moreover, the insulator 520 is not provided, which is a different point from the transistor 500 in FIGS. 13A and 13B. The oxide 530c has a two-layer structure of an oxide 530c1 and an oxide 530c2, which is a different point from the transistor 500 in FIGS. 13A and 13B.

In the transistor 510H illustrated in FIGS. 22A and 22B, the insulator 402 is provided over the insulator 512. The insulator 404 is provided over the insulator 574 and the insulator 402.

In the structure of the transistor 510H illustrated in FIGS. 22A and 22B, the insulator 514, the insulator 516, the insulator 522, the insulator 524, the insulator 544, the insulator 580, and the insulator 574 are patterned and covered with the insulator 404. That is, the insulator 404 is in contact with the top surfaces of the insulator 574 and the insulator 402 and the side surfaces of the insulator 574, the insulator 580, the insulator 544, the insulator 522, the insulator 516, and the insulator 514. With such a structure, the oxide 530 and the like are isolated from the outside by the insulator 404 and the insulator 402.

The insulator 402 and the insulator 404 preferably have high capability of inhibiting diffusion of hydrogen (e.g., at least one of hydrogen atoms, hydrogen molecules, and the like) or water molecules. For example, the insulator 402 and the insulator 404 are preferably formed using silicon nitride or silicon nitride oxide with a high hydrogen barrier property. This can inhibit diffusion of hydrogen or the like into the oxide 530, thereby suppressing the degradation of the characteristics of the transistor 510H. Therefore, a memory device including the OS transistor can have high reliability.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, as the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Accordingly, the reliability of the memory device including the OS transistor can be increased.

The oxide 530c1 is in contact with the top surface of the insulator 522, the side surface of the insulator 524, the side surface of the oxide 530a, the top surface and the side surface of the oxide 530b, the side surfaces of the conductor 542a and the conductor 542b, the side surface of the insulator 544, and the side surface of the insulator 580. The oxide 530c2 is in contact with the insulator 550.

An In—Zn oxide can be used, for example, as the oxide 530c1. For the oxide 530c2, it is possible to use the same material as that can be used for the oxide 530c when the oxide 530c has a single layer. For example, as the oxide 530c2, a metal oxide having an atomic ratio of In:Ga:Zn=1:3:4, Ga:Zn=2:1, or Ga:Zn=2:5 can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor illustrated in FIGS. 13A and 13B can also be a two-layer structure of the oxide 530c1 and the oxide 530c2.

The transistor illustrated in FIGS. 22A and 22B can be employed for the transistor 500, the transistor 300, or both thereof.

This embodiment can be implemented in combination with any of the other embodiments described in this specification as appropriate.

Embodiment 5

In this embodiment, an oxide semiconductor, which is one kind of metal oxide, will be described.

The metal oxide preferably contains at least indium or zinc. In particular, indium and zinc are preferably contained. In addition, one or more of aluminum, gallium, yttrium, tin, and the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 23A. FIG. 23A is a diagram showing the classification of crystal structures of an oxide semiconductor, typically IGZO (a metal oxide containing In, Ga, and Zn).

As shown in FIG. 23A, an oxide semiconductor is roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 23A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 23B shows an XRD spectrum, which is obtained by grazing-incidence XRD (GIXD) measurement, of a CAAC-IGZO film classified into "Crystalline". Note that a GIXD method is also referred to as a thin film method or a Seemann-Bohlin method. The XRD spectrum that is shown in FIG. 23B and obtained by GIXD measurement is hereinafter simply referred to as an XRD spectrum. The CAAC-IGZO film in FIG. 23B has an atomic ratio of In:Ga:Zn=4:2:3 or a neighborhood thereof. The CAAC-IGZO film in FIG. 23B has a thickness of 500 nm.

In FIG. 23B, the horizontal axis represents 2θ [deg.], and the vertical axis represents intensity [a.u.]. As shown in FIG. 23B, a clear peak indicating crystallinity is observed in the XRD spectrum of the CAAC-IGZO film. Specifically, a peak indicating c-axis alignment is observed at around 2θ=31° in the XRD spectrum of the CAAC-IGZO film. As shown in FIG. 23B, the peak at around 2θ=31° is asymmetric with the angle at which the peak intensity is observed as the axis.

The crystal structure of a film or a substrate can be analyzed with a diffraction pattern obtained by nanobeam electron diffraction (NBED) (also referred to as a nanobeam electron diffraction pattern). FIG. 23C shows a diffraction pattern of the CAAC-IGZO film. FIG. 23C shows a diffraction pattern obtained by the NBED method in which an electron beam is incident in the direction parallel to the substrate. The CAAC-IGZO film in FIG. 23C has an atomic ratio of In:Ga:Zn=4:2:3 or a neighborhood thereof. In the nanobeam electron diffraction method, electron diffraction is performed with a probe diameter of 1 nm.

As shown in FIG. 23C, a plurality of spots indicating c-axis alignment are observed in the diffraction pattern of the CAAC-IGZO film.

<<Oxide Semiconductor Structure>>

Oxide semiconductors might be classified in a manner different from the one in FIG. 23A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

Furthermore, in an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, In layer) and a layer containing the element M, zinc (Zn), and oxygen (hereinafter, (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are symmetric with respect to a spot of the incident electron beam which passes through a sample (also referred to as a direct spot).

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Oxide Semiconductor Structure>>

Next, the CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. In addition, the second region of the CAC-OS in the In—Ga—Zn oxide has [Ga], which is greater than that in the composition of the CAC-OS film. Alternatively, for example, [In] of the first region is greater than that in the second region, and [Ga] of the first region is less than that in the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor with low carrier density is preferably used as the transistor (specifically, refer to Embodiment 4). In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurities>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and around an interface with the oxide semiconductor (measured by SIMS) is set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Accordingly, a transistor including an oxide semiconductor that contains alkali metal or alkaline earth metal tends to have normally-on characteristics. Thus, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. Accordingly, it is preferable that hydrogen in the oxide semiconductor be reduced as much as much as possible (specifically, refer to Embodiment 4).

When an oxide semiconductor with sufficiently reduced impurities is used for a channel formation region in a transistor, the transistor can have stable electrical characteristics.

The configurations, structures, methods, and the like described in this embodiment can be used in an appropriate combination with any of the configurations, structures, methods, and the like described in the other embodiments and the like.

Embodiment 6

In this embodiment, structure examples of an electronic device that can employ the data processing system 70 described in the above embodiment will be described.

Figure 24A:
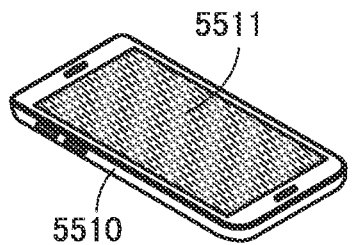
FIGS. 24A to 24C each illustrate an example of an electronic device using a data processing system.

FIG. 24A illustrates an information terminal 5500 as an example in which the data processing system 70 according to one embodiment of the present invention can be used. The information terminal 5500 is a mobile phone handset (smartphone). The information terminal 5500 includes a housing 5510 and a display portion 5511. As input interfaces, a touch panel and a button are provided in the display portion 5511 and the housing 5510, respectively. The information terminal 5500 in each specification includes a microphone, a camera, a speaker, a variety of sensors, and the like. These peripheral devices are controlled by the data processing system 70.

Figure 24B:
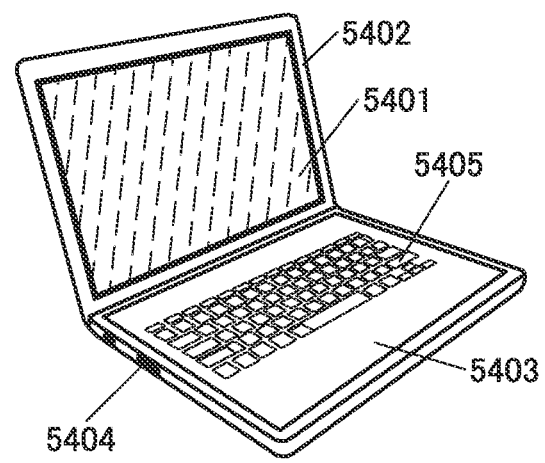

FIG. 24B illustrates a laptop personal computer 5400 as an example of an electronic device in which the data processing system 70 according to one embodiment of the present invention can be used. The personal computer 5400 includes a display portion 5401, a housing 5402, a touch pad 5403, a connection port 5404, and the like.

The touch pad 5403 functions as an input unit such as a pointing device or a pen tablet and can be controlled with a finger, a stylus, or the like. Furthermore, a display element is incorporated in the touch pad 5403. As illustrated in FIG. 24B, when an input key 5405 is displayed on a surface of the touch pad 5403, the touch pad 5403 can be used as a keyboard. In that case, a vibration module may be incorporated in the touch pad 5403 so that sense of touch is achieved by vibration when a user touches the input key 5405. These peripheral devices are controlled by the data processing system 70.

Although FIGS. 24A and 24B illustrate the examples of the mobile phone and the laptop personal computer, the data processing system 70 according to one embodiment of the present invention may be used for other electronic devices such as a personal digital assistant (PDA) or a desktop information terminal.

Figure 24C:
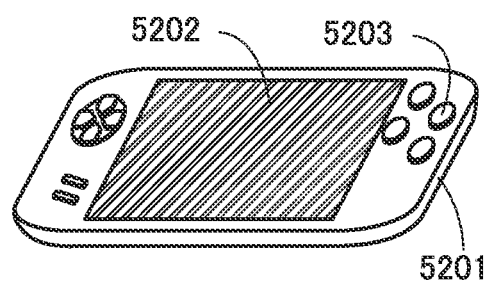

In addition, FIG. 24C illustrates a portable game machine 5200 as an example of an electronic device in which the data processing system 70 according to one embodiment of the present invention can be used. The portable game machine 5200 includes a housing 5201, a display portion 5202, a button 5203, and the like.

Although FIG. 24C illustrates the example of the portable game machine, the data processing system 70 according to one embodiment of the present invention can be used for other game machines such as a home stationary game machine, an arcade game machine installed in an entertainment facility (e.g., a game center and an amusement park), and a throwing machine for batting practice installed in sports facilities.

As described above, the data processing system 70 according to one embodiment of the present invention can be used in a variety of electronic devices. In the data processing system 70 according to one embodiment of the present invention, the storage capacity of the main memory device can be reduced, which contributes to reductions in size, power consumption, and cost of electronic devices including the data processing system 70, and the like. Furthermore, since the storage capacity of the main memory device can be increased when the data processing system 70 is activated, the electronic devices including the data processing system 70 can perform processing of a large amount of data.

This embodiment can be implemented in combination with any of the other embodiments described in this specification as appropriate.

This application is based on Japanese Patent Application Serial No. 2019-194589 filed with Japan Patent Office on Oct. 25, 2019, the entire contents of which are hereby incorporated by reference.

What is claimed is:

1. A memory device comprising:
a plurality of memory cells including a first memory region and a second memory region,
wherein, when the memory device is activated, the second memory region includes a first space in which binary data are stored, a second space in which multilevel data are stored, and a free space,
wherein the first memory region is a volatile memory,
wherein the first memory region is a first main memory device,
wherein the free space is configured to be used as a second main memory device,
wherein the first memory region and the free space are configured to be used when an arithmetic processing is performed, and
wherein the second main memory device is a nonvolatile memory.

2. The memory device according to claim 1, wherein each of the plurality of memory cells includes a transistor whose channel formation region is an oxide semiconductor layer.

3. The memory device according to claim 1, wherein the memory device is connected to an arithmetic processing device through a bus.

* * * * *